United States Patent [19]
Hirr, Jr. et al.

[11] Patent Number: 5,297,241
[45] Date of Patent: Mar. 22, 1994

[54] AUTOMATED RE-LAYOUT WITH DIMENSIONAL ASSOCIATIVITY

[75] Inventors: Otto A. Hirr, Jr., San Diego; Norman H. MacNeil, Poway, both of Calif.; F. Steve Gutierrez, Corrales, N. Mex.

[73] Assignee: Hewlett-Packard Company, Palo Alto, Calif.

[21] Appl. No.: 769,620

[22] Filed: Sep. 30, 1991

[51] Int. Cl.$^5$ .................................. G06F 15/72
[52] U.S. Cl. .................................. 395/127; 395/156; 395/157; 395/161; 395/119
[58] Field of Search ............... 395/119, 120, 121, 122, 395/125, 133, 119–127; 364/512

[56] References Cited

U.S. PATENT DOCUMENTS

| | | | |
|---|---|---|---|
| 4,829,446 | 5/1989 | Draney | 395/133 |
| 4,855,939 | 8/1989 | Fitzgerald, Jr. et al. | 364/512 |
| 4,912,657 | 3/1990 | Saxton et al. | 395/155 |
| 5,003,498 | 3/1991 | Ota et al. | 395/120 |
| 5,010,502 | 4/1991 | Diebel et al. | 395/119 |
| 5,019,961 | 5/1991 | Addesso et al. | 364/192 |

OTHER PUBLICATIONS

Solid Modelling with ME 30; Hewlett Packard; 1990, Entire Document.
Hewlett Packard Introduction Booket, "Mechanical Engineering, Series 30," Copyright 1988, Hewlett-Packard, Copyright 1986, Shape Data Ltd.
Sales Brochure entitled "Pro/Engineer The Parametic, Feature-based Solid Modeling System," Parametric Techology Corporation, Order No. PTC-DS1, 1989.
Sales Brochure Entitled "Pro/Assembly Advanced Assembly Design and Management," Parametric Technology Corporation, Order No. PTC-DS5, 1990.
Sales Brochure entitled "Pro/Design Top-Down Assembly Design and Management," Parametric Technology Corporation Order No. PTC-DS9, 1990.
Sales Brochure entitled "Pro/AFD Advanced Feature Design," Parametric Technology Corporation, Order No. PTC-DS4, 1988.
Sales Brochure entitled "Pro/Feature User Defined Features," Parametric Technology Corporation, Order No. PTC-DS3, 1988.
Sales Brochure entitled "Pro/Manufacturing Defining the Manufacturing Process," Parametric Technology Corporation, Order No. PTC-DS8, 1990.
Sales Brochure entitled "Pro/Detail ANSI/ISO/JIS Standard Detailing," Parametric Technology Corporation, Order No. PTC-DS6, 1989.
Sales Brochrue entitled "Pro/Draft Importing CAD Drawings," Parametric Technology Corporation, Order No. PTC-DS12, 1990.
Sales Brochure entitled "Pro/Develop the Developer's Tookkit," Parametric Technology Corporation, Order No. PTC-DS2, 1989.

(List continued on next page.)

Primary Examiner—Gary V. Harkcom
Assistant Examiner—Ba Huynh

[57] ABSTRACT

A method for automated re-layout of two-dimensional drawings from a solid model, wherein the solid model can be revised to incorporate design changes, for example. The re-layout process is invoked to automatically generate revised two-dimensional drawings which exactly duplicate an original set of two-dimensional drawings, except that geometry modified in the solid model will be automatically modified in the re-layout drawings. Dimensional data from the original set of drawings associated with unchanged geometry will be automatically associated with and added to the re-layout drawings. The invention permits the solid model to remain the master throughout the design process, while reliably carrying through design changes to the two-dimensional drawings. The user is not required to manually re-enter unchanged dimensional data from one drawing to the next revision.

23 Claims, 23 Drawing Sheets

OTHER PUBLICATIONS

Sales Brochure entitled "Pro/NLO Network License Option," Parametric Technology Corporation, Order No. PTC-DS15, 1990.

Sales Brochure entitled "Pro/Import Importing 3D Models and 2D Cross-sections," Parametric Technology Corporation, Order No. PTC-DS10, 1989.

Sales Brochure entitled "Pro/Interface Industry Standard Data Translators" Parametric Technology Corporation, Order No. PTC-DS11, 1990.

Sales Brochure entitled "Pro/Engineer Integrated Automation Tools for Mechanical Design and Manufacturing, Parametric Technology Corporation", Order No. PTC-DS1, 1988.

Sales Brochure entitled "Pro/Project Project Management System," Parametric Technology Corporation, Order No. PTC-DS14, 1990.

"Parametric Takes Mechanical CAD/CAM to Limit," Mass High Tech, vol. 8, No. 3, Nov. 20–Dec. 10, 1989.

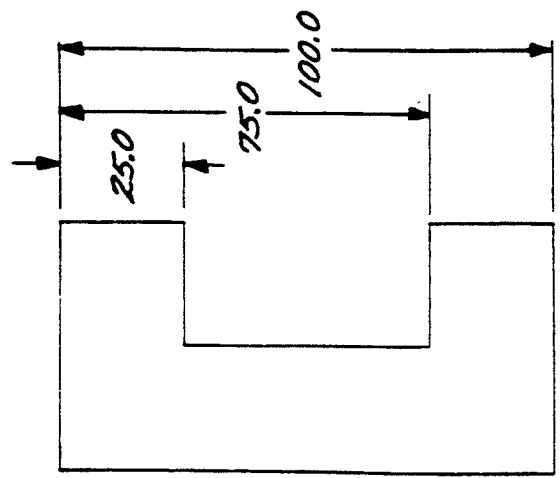
FIG. 5A  DATUM LONG
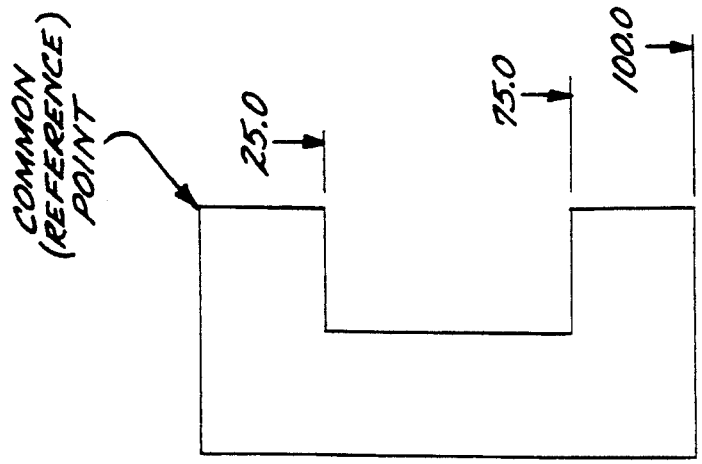
FIG. 5B  DATUM SHORT
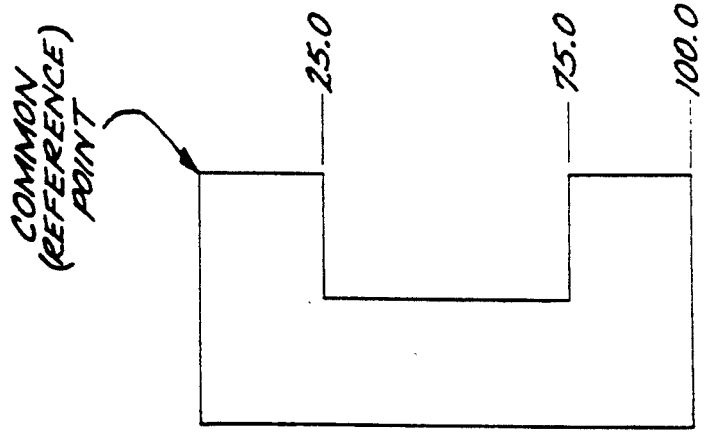
FIG. 5C  DATUM COORDINATE

| LAYOUT 3D→2D | |
|---|---|
| -DIRECT VIEWS- | |
| FRONT [WP1] | BACK |
| LEFT | RIGHT |
| TOP | BOTTOM |
| | |
| -ANGLED VIEWS- | |
| LEFT TOP FRONT | RIGHT TOP FRONT |
| LEFT BOTTOM BACK | RIGHT BOTTOM FRONT |
| | |
| LEFT TOP BACK | RIGHT TOP BACK |
| LEFT BOTTOM BACK | RIGHT BOTTOM BACK |
| | |
| -SET VIEW ANGLES- | |
| | VIEW ISOMETRIC |
| | VIEWS @30 |
| | VIEWS @60 |
| | SCALED ISOMETRIC |
| | USER SELECT ANGLES |
| | |
| -AUXILIARY- | FACE/ANGLE |
| | AS SHOWN |
| | |
| -SECTIONAL- | SELECT VIEW |
| | |
| OPTIONS | |
| HIDDEN ON/OFF | MERGE LINES OFF/ON |
| HATCH ON/OFF | CONSTRUCTION ON/OFF |
| VIEW SPACING | |
| | |
| *GENERATE VIEWS* | |
| | |
| -CREATE- | DETAIL |
| | |
| 3D REFERENCE POINTS | |
| ADD POINTS | DELETE POINTS |
| | |

FIG. 17

| RELAYOUT/REDIMENSION | |
|---|---|
| *COMPLETE UPDATE* | |
| -RELAYOUT- | NO DELETE |
| | DELETE OLD |
| -REDETAIL- | NO DELETE |
| | DELETE OLD |
| -REDIMENSION- | DRAWING |
| | CONVERT SHORT TO LONG |
| -SET SHOW OPTIONS- | OFF |
| ON | COLOR (TEMPORARY) |
| ONLY | |
| -SHOW ITEM- | ALL |
| OLD GEOMETRY | NEW GEOMETRY |
| OLD DETAIL | NEW DETAIL |
| MODIFIED GEOM DIMENS. | EXACT DEMENS. |
| HIDDEN LINES | 3D CONSTRUCTION |
| REFERENCE POINTS | 3D HATCHING |
| -SELECT- | |
| OLD GEOMETRY | NEW GEOMETRY |
| OLD DETAIL | NEW DETAIL |
| MODIFIED GEOM DIMENS. | EXACT DIMENS. |
| HIDDEN LINES | 3D CONSTRUCTION |
| | 3D HATCHING |
| -EDIT INFOS.- | EDIT ELEMENTS |
| | EDIT PART (VIEW) |

FIG. 18

AUTOMATED RE-LAYOUT WITH DIMENSIONAL ASSOCIATIVITY

BACKGROUND OF THE INVENTION

The present invention is an improvement in the field of computer-aided design, and more particularly, an advancement in the solid modeling arts.

The use of a three-dimensional (3D) representation of an object (commonly referred to as a solid) can be an advantage to the part designer using a Computer Aided Design (CAD) system. Solid modeling is a computer representational method of describing objects in three-dimension (3D) space. There are various techniques known in the art in which this may be implemented. Solid models are commonly constructed either with primitive or boundary definition, which permit modeling the solid nature of the object, though the models often appear on the output device in a similar manner as wire frame representations. The modeler program has an understanding of what geometry coordinates would be formed "inside" and "outside" the modeled body. The solid model is manipulated by a solid model software package.

Two-dimensional (2D) representations of objects are projections of object features onto a viewing plane, typically embodied in 2D drawings. In addition to geometric elements, the 2D drawings may also contain text, dimensions and other supporting information, i.e., annotations. The two dimensional representation can typically be manipulated by a two dimensional software package.

Some CAD systems are designed such that the 2D portion is linked to the 3D portion, and changes in the solid (3D portion) cause appropriate changes in the 2D drawing. Such systems are described as associative. The particular feature of an associative system that pertains to this invention is the built-in ability to update the 2D drawing and dimensions when a change is made in the solid. This capability is due to the associativity between the dimensions, the solid, and the 2d representation. A limitation of prior associative system is the too-specific coupling to the solid, which prevents a more general usage, such as redimensioning between different solids or to the creation and dimensioning of multi-facetted cross sections. Associative systems usually rely on parametric methods to manage their many positive attributes. Parametric, in this case, refers to the fact that each feature of the body must be described in terms of some other feature or features at the time of its creation. For example, the location of a hole being placed in a block must be completely specified (perhaps by giving its distance from two edges). Though helpful in many ways, including updating the drawing to the model changes, parametric requirements can be a problem at times. It can be a disadvantage to be required to always enter the parameters for each feature as it is created since the relationships of the new feature to the existing ones may not yet be known. If it is necessary to change the reference items (e.g., pick two other edges as references), the user must usually create a new hole and then delete (or inactivate) the old hole. Thus, this can be a tiresome requirement.

There exist some solid modeling implementations which are strictly solid modelers. They provide no functionality in depicting dimensions, text, or other supporting annotation in conjunction with the solid model. With rare exception, this type of annotation is a necessary accompaniment with the geometry. One technique to remedy this problem is to provide an interface between the solid modeler and a 2D documentation package. The 2D documentation package typically contains a group of tools to both annotate a 2D drawing and to quantify different aspects of the planar projections used to depict an object that is, frequently, intended for manufacture. These tools could include a dimensioning package that allows the placement of dimensions, with various tolerance descriptions, on the drawing; a text generating package to allow the placement of Title, Drawing Identification Numbers, note or any other verbiage on the drawing; a symbol generating package to take care of the need of producing drawings using the industry standard symbols, for example, those used in Geometric Dimensioning; and a minimum set of geometry creation tools to allow the generation of whatever lines, arcs, arrows, etc. that would be needed to complete the documentation by adding partitioning, underlining, indicating sectioning planes or any of many needs, and the 2D drawing capabilities needed to produce the 2D drawings being documented.

The interface between the solid modeler and the 2D documentation package generates the feature projections onto a plane. The planar features are passed to the 2D documentation package which supports dimensioning, text, and other annotation features. The process of passing the 3D model features into the 2D documentation package will be referred to herein as "laying out" the solid model or the "layout process." In other words, the layout process refers to the process of projecting the solid model onto a plane. The solid model may be oriented in different locations relative to the plane on which the projection is made. This creates different views of the solid model. Some common views are front, side, top, bottom, left, right, and isometric.

An implementation of a strict solid model, documentation package, and layout mechanism is Hewlett Packard's Mechanical Engineering Series 30 (hereinafter the "ME 30" or "HP ME 30"). The sequence of use is typically to create a solid model, generate a 2D representation using the layout mechanism, and add dimension, text, and other supporting annotation to the 2D representation. The 2D representation, which may include annotation, will hereinafter be called a "drawing."

The ME 30 system, through the layout mechanism, provides a one-way, one-time association from the solid model to the 2d documentation package. A solid model system is typically used to model objects prior to their construction. The solid model is frequently changed as the design evolves from initial conception to final form. Any change to the solid model will once again require the invocation of the layout process if the geometry in the 2D world is to be an accurate representation of the solid model. Each invocation of the layout process generates a new 2D representation of the solid model. A problem occurs because there is no method of transferring the annotations from the previous 2D drawing to the new 2D drawing. This means that the new layout must be dimensioned and annotated once again, which may be a very time consuming task.

For anything but extreme feature changes to the part, redimensioning is considered unacceptable in the typical design process. Therefore, in the typical conventional design process, the part is layed out once and then dimensioned. From this point on, the solid model and the 2D drawing become autonomous entities. Changes can be made to the model and these may (or may not be) manually depicted in the 2D drawing. This conventional process is generally depicted in the operational flow diagram of FIG. 1. Thus, the 3D model is initially created (step 1), and the first layout drawing is created (step 2) and the dimensions added (step 3). Now assume the design process involves some changes to the product under design. The 3D model is modified (step 4). Without re-invoking the layout process, the designer modifies the geometry and adds dimensions to the layout drawing (step 5). The modified 3D model and the layout drawing have now become autonomous entities. As this process is repeated (steps 6 and 7), the solid model and 2D drawing may diverge even further. Now there is no assurance that the modified 2D drawing correctly reflects the solid model.

The design process illustrated in FIG. 1 presents several problems. First, since there is no assurance that the modified drawing correctly represents the solid model, two definitions of the object geometry exists. There is a high probability that a Computer Aided Machine (CAM) using the solid model as the geometry definition will produce a different object from a CAM using the drawing as a geometry definition. Hence, there are two geometry definitions - the solid model and the drawing. Since different objects may result, considerable time and money may be wasted if objects are built to the wrong specification, caused by confusion as to what is the master geometric definition.

Second, often users will abandon the solid model after its initial creation. They will then only modify the drawing. The whole purpose of design is to implement functionality through the interacting forms of different objects. The solid modeling process enables the user to model the objects and their interaction with each other. To abandon this ability later in the design process defeats the purpose of this tool. Frequently a solid model, later in the design process, may be useful. However, if they have been abandoned, it may be too time consuming to bring the models up the current geometric definition.

Third, the user often does not model all of the geometric detail of the object because they know that they will abandon the solid shortly down the design process. Again this defeats the purpose of solid modeling which is to mimic the object for analysis with other objects before it is even built.

It is therefore an object of the invention to provide an interface between a solid model and a 2D documentation package which automates a re-layout process, whereby geometry changes in the solid model can be automatically incorporated into a revised set of layout drawings.

A further object of the invention is to provide such an interface which automatically transfers valid dimensional annotations from one layout drawing to the next version or re-layout of that drawing.

SUMMARY OF THE INVENTION

A method is described for interfacing between a solid modeler system which describes objects in three-dimensional (3D) space and a two-dimensional documentation package which provides two-dimensional (2D) representations of objects which are projections of object features onto a viewing plane. The method comprises the following steps.

A 3D model of the object is created. Once the 3D model has been created, a 2D layout process is invoked to generate one or more desired 2D layout representations or views which are projections of the 3D model onto a viewing plane. For each such representation, sufficient projection format information is associated with the representation to permit the representation to be exactly reproduced later.

Dimension data can thereafter be added to the 2D representations. The dimensioned 2D representations with the projection format data are then stored.

Thereafter, the 3D model of the object is modified to incorporate geometry changes in the object. An automated re-layout process is invoked to generate modified views or representations of the stored 2D representations which embody any geometry changes resulting from the modifications of the 3D model. The modified 2D representations automatically include those dimensions which are still valid after the geometry changes. The re-layout process employs the projection format data to automatically generate the modified 2D representations at exactly the same projection references as the original representations. Thus, the user is not required to manually re-enter that dimension data on the modified 2D representations which has not changed as a result of the geometry changes in the 3D model.

BRIEF DESCRIPTION OF THE DRAWING

These and other features and advantages of the present invention will become more apparent from the following detailed description of an exemplary embodiment thereof, as illustrated in the accompanying drawings, in which:

FIGS. 5A-5C illustrate three methods of dimensioning.

FIG. 17 illustrates an exemplary layout creation menu which may be employed in the process of FIGS. 6-16.

FIG. 18 illustrates an exemplary relayout/redimension menu which may be employed in the process of FIGS. 7-16.

DETAILED DESCRIPTION OF THE PREFERRED EMBODIMENT

Overview of the Invention

The invention is embodied in an interface between a solid modeler, which describes objects in three-dimensional (3D) space, and a two-dimensional (2D) documentation package, which provides 2D representations of objects which are projections of object features onto a viewing plane. In accordance with the invention, the interface associates with each 2D representation a set of projection format information sufficient to permit the representation to be reproduced from the 3D model later. Thereafter, the geometry of the 3D model can be modified, and the geometry changes can be automatically incorporated in modified layout drawings by invoking a re-layout process. This process employs the projection format data to generate a new set of layout drawings from exactly the same projection positions relative to the 3D model as the original layout drawings were made.

In effect, the new layout is placed on top of the old geometry of the two dimensional layout drawings. Moreover, the dimension information from the original 2D drawing is extracted, to permit the old dimensions to be superimposed on the new geometry. The new process addresses the problems described hereinabove because it can simplify the regeneration of a new 2D drawing to a few menu selections. After regeneration of new layouts, only the dimensions that need modifying and newly created feature geometry will require attention. With the invention the geometry definition master can be the solid model.

The operation process employs a set of macros that facilitate the initial specification and generation of the part layout. These macros store the necessary information so that the layout may be regenerated such that unmodified geometry lies in the same location as before. Included are macros which allow the user to highlight, by various methods, the old and new layout geometry. Another set of macros facilitates the extraction and creation of dimensions on the new geometry. These include macros which highlight the dimensions which need to be modified because they annotate geometry which differs from the previous 2D drawing.

An Exemplary Embodiment

Figure 2:
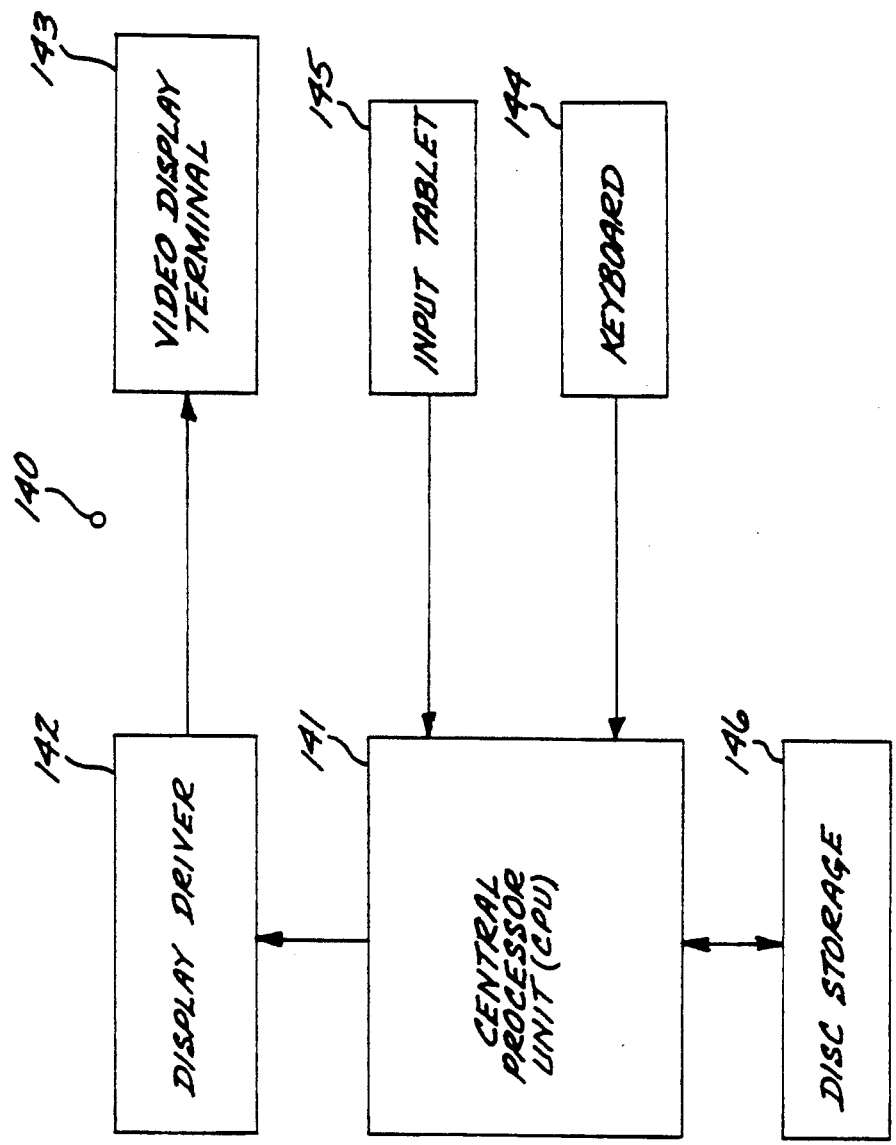
FIG. 2 is a simplified block diagram illustrative of a computer aided design workstation which may be configured

The following describes an embodiment of the invention which is operating on a Hewlett Packard Mechanical Design system ME 30. This system may be installed, for example, on a computer workstation such as the Hewlett-Packard 9000 workstation 140, whose principle elements are shown in FIG. 2. These elements are the CPU 141, the display driver 142, the video display terminal 143, the keyboard 144 and the input tablet 145, and disc storage 146.

Figure 1:
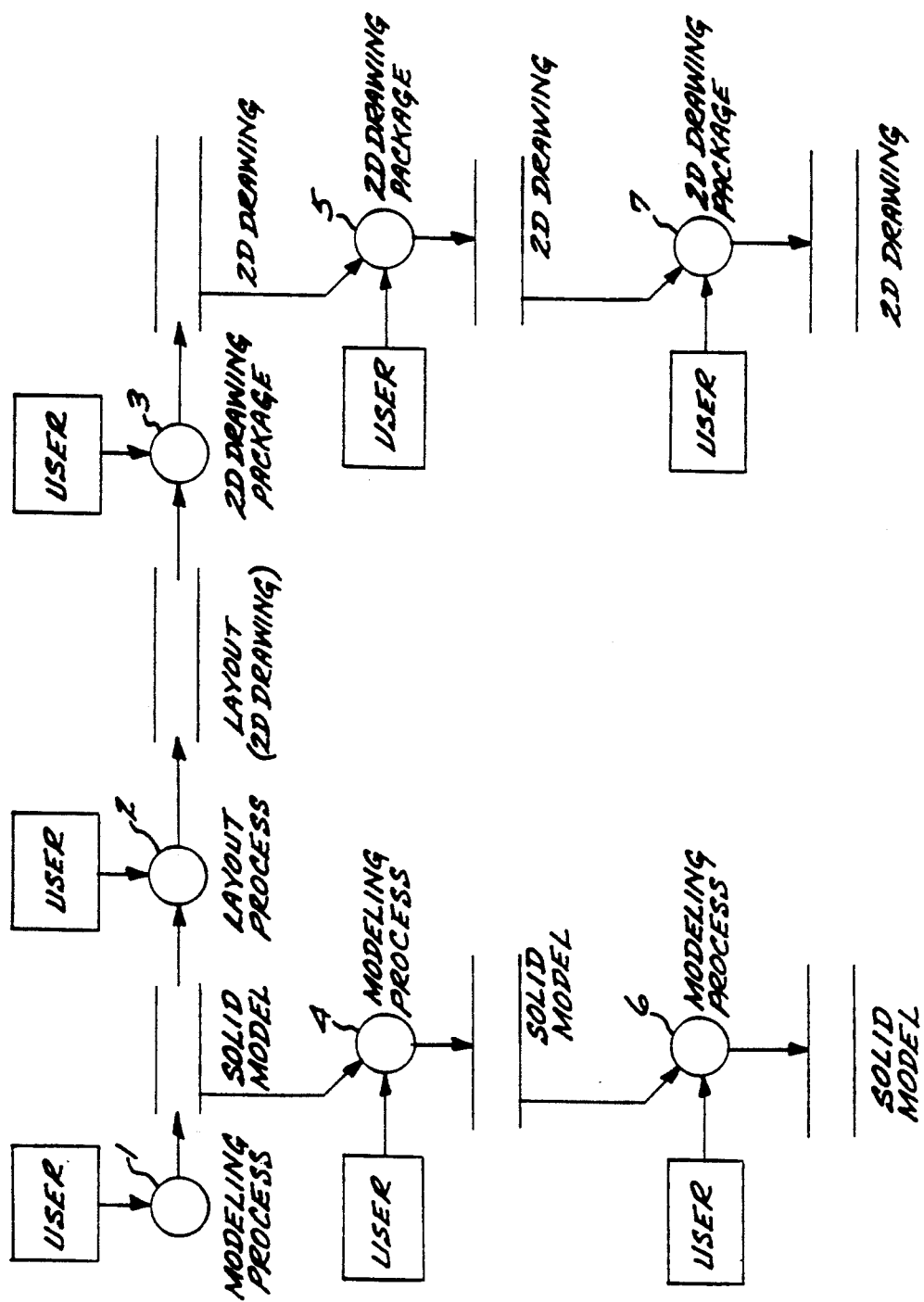
FIG. 1 is an operational flow diagram illustrative of a design process employing 3D and 2D computer-aided design tools.
Figure 3:
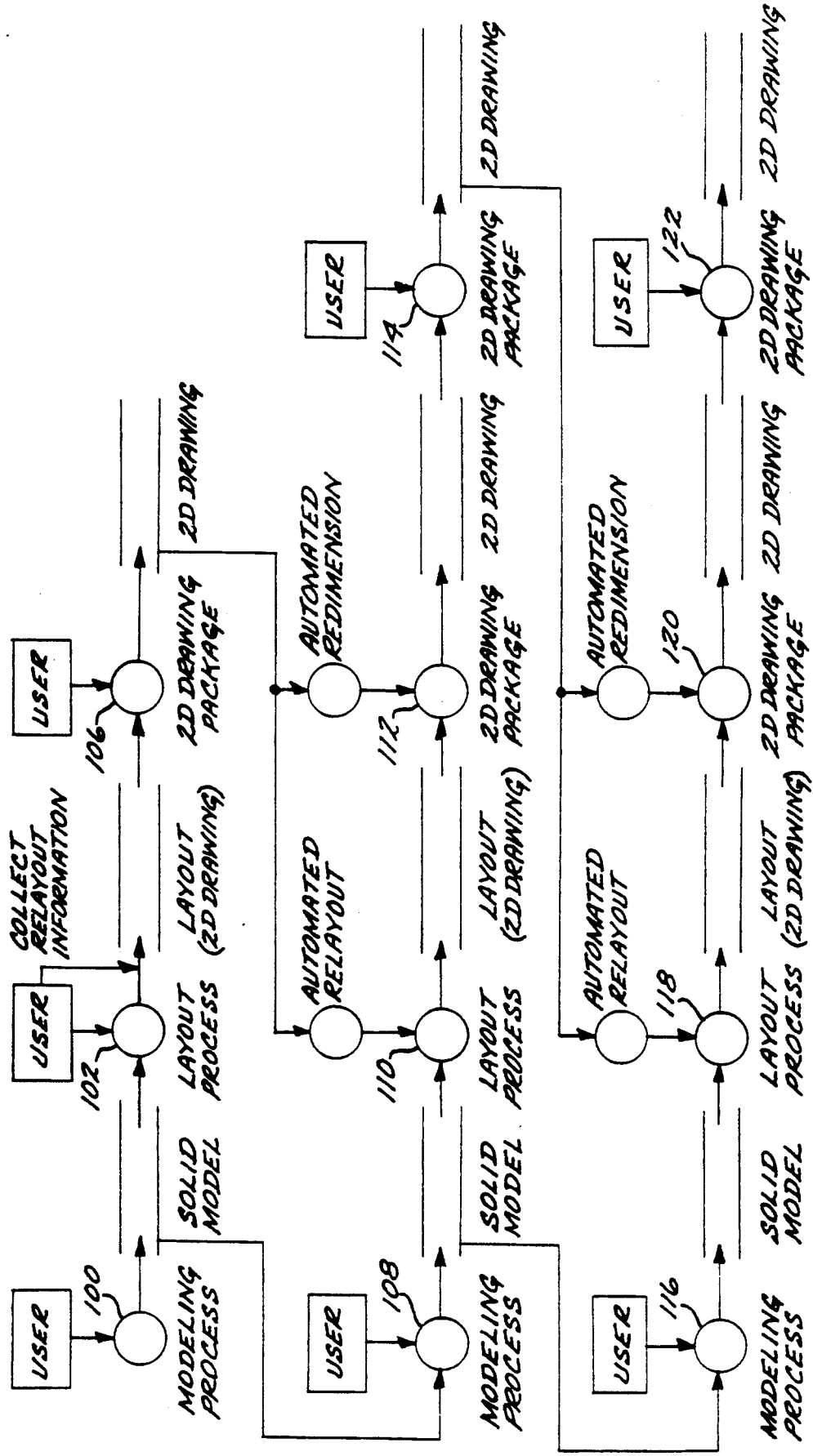
FIG. 3 is an operational flow diagram of a computer-aided design process in accordance with the invention.

FIG. 3 is a flow diagram of the overall process in accordance with the invention. As in the conventional design process of FIG. 1, the first step is to create a 3D model of the object under design (step 100). Working, by way of example, from the default viewport configuration of the ME 30 (as an example, which comprises two 3D windows and one 2D window), the user thereafter begins the first layout of the solid model (step 102) through a menu selection. An exemplary layout creation menu is shown in FIG. 17. There are many predefined views which may be selected from the menu. These include normal, angles, sectional, and auxiliary views. The process also allows the generation of user defined views. The definition of the initial layout progresses rapidly because the views are initially depicted in outline form so there is little time lost in redrawing the geometry. The initial depiction of the views as simple cuboids (outlines) is a feature of this invention. Its inclusion allows the original layout of the drawing from the solid model to proceed at a reasonable pace. Without this feature the user interactive layout process would be continually interrupted with possibly long waiting periods while each new view was laid out onto the 2D drawing. Each representation of the cuboid contains a minimum of four to a maximum of twelve lines depending on how the view was oriented and what sort of presentation mode is selected. Information can be extracted from the HP ME 30 system to specify a simple volume of space defined by planes parallel to the XY, YZ, and ZX coordinate axis planes that exactly describes the maximum extent of a selected solid or solids in this system. The information supplied by the system is in the form of two three-dimensional points that specify a diagonal of the above rectangular volume (or cuboid).

This information is used in the invention to find another cuboid that is referenced to the front view orientation so as to produce a cuboid that is aligned with that front view. The appearance of the cuboid is that of a simple box that has six orthogonal sides. It is displayed using the edges of that box.

Figure 4A:
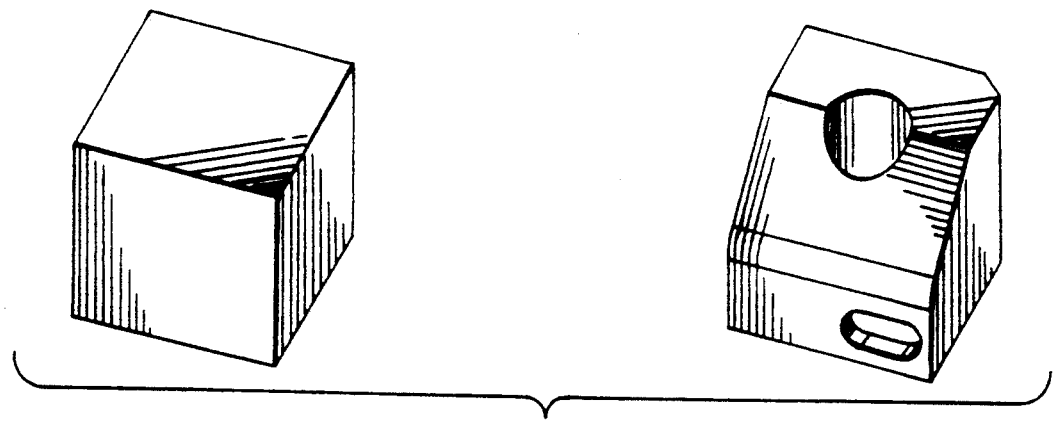
FIG. 4 illustrates the feature of initially creating a cuboidal representation of a projected view of the solid model.
Figure 4B:
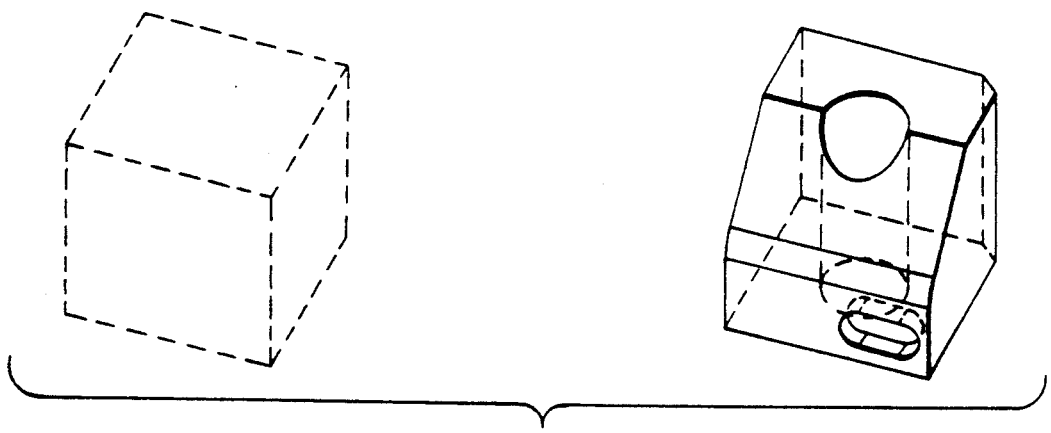
Figure 4C:
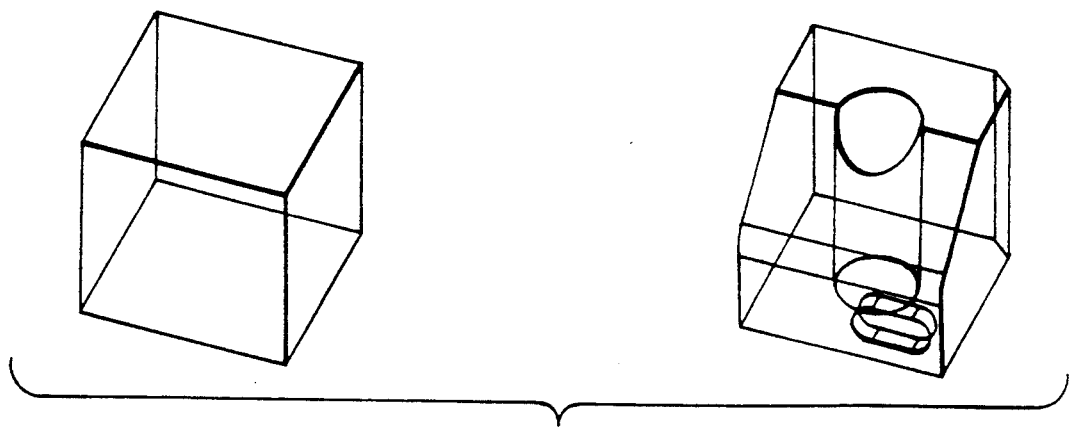

Three options are available regarding the display the edges of the cuboid. In option one (FIG. 4A) the only normally seen edges are displayed if the yet-to-be-rendered view is to show only the visible edges. In option two (FIG. 4B) the same lines are shown as in option one but as dashed lines where the yet-to-be-rendered view will show, additionally to that of option one, normally unseen edges as dashed edges. In the third option (FIG. 4C) all the edges, normally seen and unseen, are drawn if the yet-to-be-rendered view will also display all edges as in a normal wireform presentation.

Magnified details are available as a post layout operation.

Each view contains all the information needed for its own future recreation. The information needed for this recreation depends on the type of view. For a standard view, this information includes: a list of the solids used in the current view, solids orientation (to obtain the correct projection onto the drawings), view position on the drawing, type of rendition (what projected edges of the model are to be shown and whether they are to be shown in solid or dashed lines, i.e., show only visible as solid lines, show all edges with visible as solid lines and hidden as dashed lines, or show all edges as solid lines), and whether to display other features (construction lines, tangent edge lines, and 3D hatching lines). The information required for a sectional view includes all the above information for the standard view, as well as a list of the particular solids to be sectioned, the solid(s) orientation for sectioning (material temporarily removed), and a list of points used to create the polygonal tool used to remove material. The information required for a "detail magnify" view includes the name of the view to be detailed (an already existing view is in the drawing), the magnification factor, the detail points (diagonal corners of a box containing the portion to view), and the reference point (point that marks the beginning of detail translation) (the destination point is part of the drawing itself). For each type of view, information is also attached to each individual element (lines, arcs, etc), including the $L32_{13}$ version number, which equals the current version of the software (currently $L32_{13}$ version equals 1.20) and one of the following: $NEW_{13}$ GEOM, $OLD_{13}$ GEOM, $NEW_{13}$ DETAIL, $OLD_{13}$ DETAIL, $dim_{13}$ $assoc_{13}$ $created_{13}$ no, $dim_{13}$ $assoc_{13}$ $created_{13}$ yes, $L32_{13}$ $rf_{13}$ pnt, or $L32_{13}$ $dm_{13}$ pnt. The variable $L32_{13}$ version is set to a certain value so that interested users can find out under what version of the code the drawing under question was created. Once the layout has been defined, view generation, which changes the outline form of the view into the actual geometry, is begun through another menu selection. This process may be very lengthy, so it has been made to run without user intervention. The view generation process creates a completely rendered view to replace each of the cuboidal representations found in the drawing.

At this point, the layout is complete. Views can be added, deleted, or repositioned at any time in the life of the drawing. The finished drawing is created by adding dimensions, notes, drawing borders as required (step 106).

Now assume that the user wishes to modify the solid body to reflect design changes. This occurs at step 108. After the user has modified the solid body, user loads the previous 2D drawing into ME 30 and starts the relayout process (step 110) through a menu selection. The relayout is an automatic procedure. Once started it will run unattended from the beginning of the layout until it finishes after redimensioning the drawing (step 112). As an option, each segment of the complete relayout can be run separately. Each runs automatically to complete the segment chosen. The segments are:

1. Create the new geometry of the views (old geometry still present). This segment is described more fully with respect to FIG. 12. This allows easy editing of the new geometry as may be required for some reason.
2. Remove the old geometry and integrate the new geometry into each view.
3. Create the DETAIL MAGNIFY new geometry.
4. Remove the OLD DETAIL geometry and integrate the detail geometry into each view.
5. Redimension the drawing. (Redimensioning is a separate process to be run only after the relayout process is complete, but it can be invoked at the same time the relayout process is selected by selecting the menu choice "* COMPLETE UPDATE *" as shown at the top of the menu in FIG. 18. Dimensioning will automatically occur after the relayout process is complete.)

The relayout process (step 110) uses the information from the infos attached to the various views in the 2D drawing to layout the new geometry which is placed directly on top of the original. Each "info" is a string of information that can be attached to various components of the 2D drawing structure. Many strings can be attached to the same component. By "string" is meant, in one exemplary embodiment, a line of characters that begins with and ends with a quotation mark or, as a substitute, an apostrophe. In one exemplary embodiment, each string can contain a total of 1024 characters. Strings can be attached to the basic elements (lines, arcs, points, text, etc) and to "parts" in the part structure. A "part" is a special groupings of elements or other parts that can be arranged in a hierarchical structure.

Any or all infos can be accessed and the information used for various purposes (after separating from the string, if necessary). The visual effect of placing the new geometry on top of the original geometry would be the exact covering of the original lines with the new ones. That is, each line superimposed on another would have the identical parameters. Straight lines would have the same end points, circles the same centers and radii, etc.

The infos used in this exemplary embodiment are listed below as info items 1 through 9. All views except DETAIL MAGNIFY use info items 1–6.

1. Partname$_{13}$ S1:Origin:U$_{13}$ pos:U$_{13}$ neg:V$_{13}$ pos: V$_{13}$ neg:W$_{13}$ pos:W$_{13}$ neg: Each item is a three dimensional point in the absolute global X,Y,Z coordinate system. Together, Origin, U$_{13}$ pos, and V$_{13}$ pos specify the reference view (front view) by specifying its local coordinate system (workplane HP ME 30). Each PART contains this same reference view information.

2. Partname$_{13}$ WP:Origin:U$_{13}$ Pos:V$_{13}$ pos: Each item is a three dimensional point relative to the reference view in INFO item. These points establish the view workplane relative to the reference view (front view) and hence position the view for relayout.

3. Partname$_{13}$ LT:Sketch:Hidden$_{13}$ line:Hiddot: Merge$_{13}$ line:3D$_{13}$ hatch: 3D$_{13}$ construction:

Qualifiers ON or OFF are used to control what view parameters to set in order to display the view in the manner originally chosen.

4. Partname$_{13}$ BL:Body$_{13}$ name1:Bodyname2:etc:

This item is a list of bodies used in creating the view. Partname$_{13}$ AL:Assembly$_{13}$ name1:Bodyname2:etc:

This item is a list of assemblies used in creating the view. (An assembly is a grouping of bodies and possibly other assemblies.)

6. Partname$_{13}$ CP:Number:Current$_{13}$ PART(s):

Number, the first item is the count of the 3D parts to be set to be CURRENT and thereby become the object of Sectioning. These 3D parts are listed in the second part of the INFO. (A non-sectional view contains a 1 and lists only one PART).

7. Partname$_{13}$ SR:Origin:U$_{13}$ Pos:V$_{13}$ pos:

This info item is only used for a sectional view. See info item 2 above for use. The item orients the body for the sectioning operation.

8. Partname$_{13}$ SP:Point1:Point2: :PointN:Ponit1:END:

This item is only used for a sectional view. Each item is a two dimensional point used to create the polygonal PROFILE for sectioning the body or bodies.

9. Detailname$_{13}$ DM:Sourcename:MagFctr:RelBoxCorn1: RelBoxCorn2: BeginPt: Sourcename is the name of the view to be edited and whose selected geometry is scaled by MagFctr and then used for the detail. The next three items are 2D points that "box" the geometry and supply a reference point for move. The destination point is extracted from the Detail reference point.

After the layout is complete, tools are provided which will allow the user to highlight and manipulate the old and new geometry. Geometry not created by the layout process is unaffected because it is not marked as coming from the layout process.

After discarding the old geometry, the 2D drawing resulting from the relayout process is ready for redimensioning, which is begun through a menu selection. The fundamental requirement of the automated redimensioning process (step 112) is to replace all pre-existing dimensions. The major implementation issue is how to deal with dimensions attached to geometry that has been added, deleted, or modified due to changes to the solid model. It was believed that users resented the need to recreate dimensions on geometry that was unaffected by their changes to the solid model. However, it is palatable to modify only the dimensions that were attached to affected geometry. Therefore, the basic premise in redimensioning in accordance with the invention involves : (1) replacing dimensions on unmodified geometry and (2) recreating dimensions attached to modified geometry as they previously existed. In order to reproduce a dimension as it previously existed, support geometry is included. Support geometry is a term used to describe points, straight lines, arcs, or circles added to a drawing to recreate a piece of geometry that is missing because the view has changed due to changes in the solid that is projected onto the drawing plane. Dimensions can only be placed on existing geometry so the "support geometry" is placed so that the dimension originally at that location can be placed on the drawing at that same location.

Both the support geometry and the dimension are marked with infos so that they can easily be detected so that whatever is different can be recognized and the proper correction applied.

All dimensions that require user modification should be retained on the drawing at least until the user of the program has determined what should be done concerning them. They can be moved to another location, removed, or new ones created. If new ones are created the old dimensions can serve as a model for the new ones as regards their tolerances and any notes that were integral to the dimension. Dimension modification is facilitated through the highlighting of both the dimension and its supporting geometry. Most importantly, dimensions which are not highlighted are the same as on the previous drawing.

Once the automated redimensioning process (step 112) has been completed, the user can then modify the resulting 2D drawing at step 114 to change highlighted dimensions attached to geometry which has changed, or make any other changes desired. The process of revising the solid model can be repeated any number of times, with the automated relayout and redimensioning processed invoked again, as shown in steps 116, 118, 120 and 122 of FIG. 3.

The general process in accordance with the invention is as follows:

1. A solid model is made of the object.
2. A drawing, i.e., a 2D representation, is produced using the solid (3D) representation to produce projections of the solid on planes chosen to produce the desired views under program control.
3. While each view is being created, information that specifies the proper projection position and other parameters specifying the projection format is stored in association with each view. This information is sufficient to reproduce, at some future time, the view being created.
4. The drawing is then dimensioned using the normal tools supplied with the CAD program. Other information (notes, for example) can also be added to the drawing at this time.
5. The drawing is then filed in the usual manner so that it can be recalled at some future time.
6. The solid, as required by a design change for example, is modified as necessary.
7. The re-layout process is invoked, resulting in the exact duplication of the original 2D views, except that new or modified geometry is located at a new position. Geometry that has not changed is located in the same position as before.
8. Remove all the old geometry.
9. At this point, dimension information from the file created in step 5 is used in a process to place the dimensions back on the drawing, as much as possible, in their original positions. Checks are made to compare the geometry where these dimensions are to be placed with the geometry to which they were attached in step 4. These tests determine whether the geometry is probably the same or not. If it is decided that the geometry is the same then the dimensions are placed on it. If found different, special geometry is created in the drawing and the dimensions are then attached to it. Special colors and information tags are associated with these special geometry elements and the dimensions attached to them as necessary to make them obvious to the user so that they can be corrected, replaced or deleted as is necessary. If, for example, no changes had been made, then all the views would be created exactly like the first layout produced, and all dimensions would be placed on the new layout exactly as on the original drawings.

A separate and added benefit of this process is the ability to convert some of the dimension types to another dimension type. FIGS. 5A–5C illustrate three dimensioning types. FIG. 5A illustrates a "datum long" dimension. FIG. 5B illustrates a "datum short" dimension. FIG. 5C illustrates a "datum coordinate" dimension. Datum coordinate and datum short dimensions do not show the common datum. A normal dimension indicates the distance between two points. Datum short and coordinate dimensions are usually used where a group of dimensions all reference a common point. Since the dimensioning geometry would point to the common point for each dimension, an alternative dimensioning scheme is used where the geometry pointing to the common points is not created in order to reduce the number of lines on the drawing and thereby increasing the clarity. Two styles of this single point dimensioning are employed. One, "datum short," uses an arrow and the dimension text while the other, "datum coordinate," only uses the dimensioning text which is usually placed at the end of the dimensioning line (this line approaches but usually does not touch the point being dimensioned).

A problem arises when the user annotates a group of features and later comes back to annotate other features from the same common datum; they may inadvertently pick the wrong entity as the common datum. To validate whether the short or coordinate dimensions are based from the correct entity, in an exemplary embodiment run on the ME 30 system, users use the "MEASURE" function. The "MEASURE" function is a tool of the HP ME 30 CAD package that allows measuring between different parts of a drawing. All geometry created with this CAD package has a defined length or other physical attributes assigned to it, such as: angle, radii, position (point coordinates), etc. The MEASURE function can be used to verify that the dimension is indicating the true value and, therefore, must be attached to the common point. This is a laborious and indirect way of discovering to what point (the common point) the dimension is attached. Through a common line option, datum long dimensions may be generated in place of the short or coordinate. This is used only for datum validation. "Datum long" refers to dimensioning that indicates the common point for a series of dimensions as opposed to the datum short and coordinate dimensions which do not indicate the common point for a series of dimensions. The ability to convert a dimension from one of the single ended dimensions ("datum short" or "datum coordinate") to a "datum long" dimension is not a part of the relayout macro. It is a separate tool that is a "spinoff" of the relayout program in that the ability to extract dimensions from the drawing and to discover their type has already been implemented. It is only necessary to change the dimensions types to that of the "datum long" format and to remove all other dimensions and then redimension using only these converted dimensions.

Figure 6:
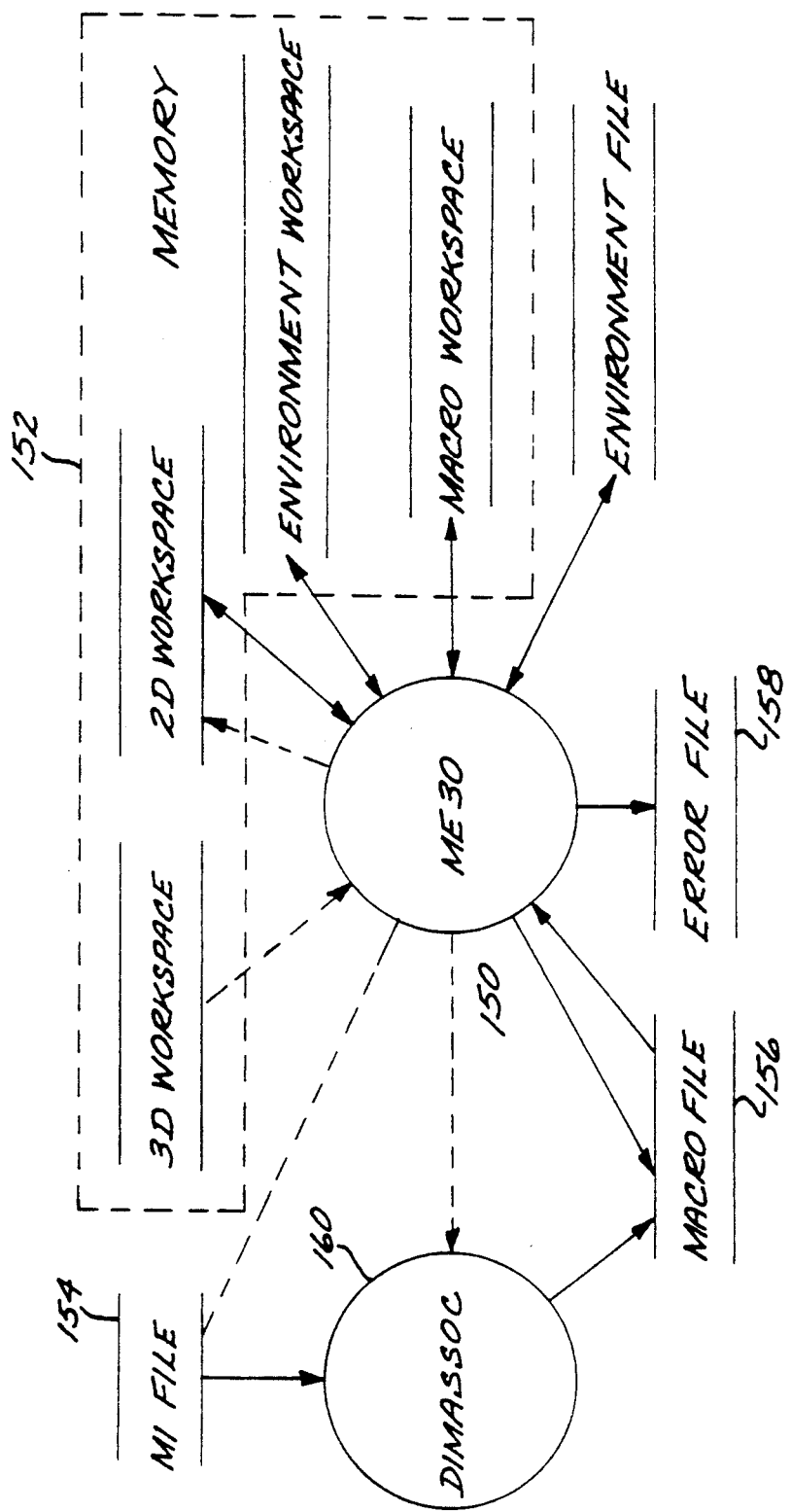
FIG. 6 is a data flow diagram of an overall exemplary process embodying the invention.

FIGS. 6-16 further illustrate a process operating on the Hewlett Packard ME 30 design system which embodies the present invention. FIG. 6 is a data flow diagram of the overall process. The ME 30 operating process is depicted as process 150, which interacts with memory 152 to use the various workspaces created in the memory, i.e., the 3D workspace, the 2D workspace, the environment workspace and the macro workspace. The ME 30 process 150 also has access to various files stored in memory, i.e., the MI file 154, the macro file 156 and the error file 158. The process "DIMASSOC" 160 illustrates the interfacing process added to the ME 30 system to provide the above described automated dimensioning capabilities.

To create a relayed out drawing, the new solid model is loaded into the 3D workspace and the old MI file containing the existing 2D representation is loaded into the 2D workspace. Invocation of the relayout macro extracts the positioning information from the 2D workspace. The positioning information is used to layout the 3D model into a 2D drawing from the 3D workspace to the 2D workspace. The data flow for this process is shown with dashed lines. Since the annotated drawing is used for the relayout, all annotations, except hatch, are saved.

When the user selects the screen menu command to redimension the drawing, he enters the file name of the old MI file, after which the DIMASSOC process 160 is commenced. This process reads the MI file and generates macro commands to redimension the drawing, placing them in the Macro file. After it is complete, the macro which initially ran the process 160 appends a call to the first redimensioning macro and inputs the Macro file. The input loads the macros into the Macro workspace and begins their execution. Since the macros will modify the current environment, the environment work space is saved in the environment file for restoration prior to completion. If any errors are discovered during the macro execution, messages are written to the error file 158. The last macro deletes all of the redimensioning macros so that the macro workspace should be as it was prior to its invocation.

Figure 7:
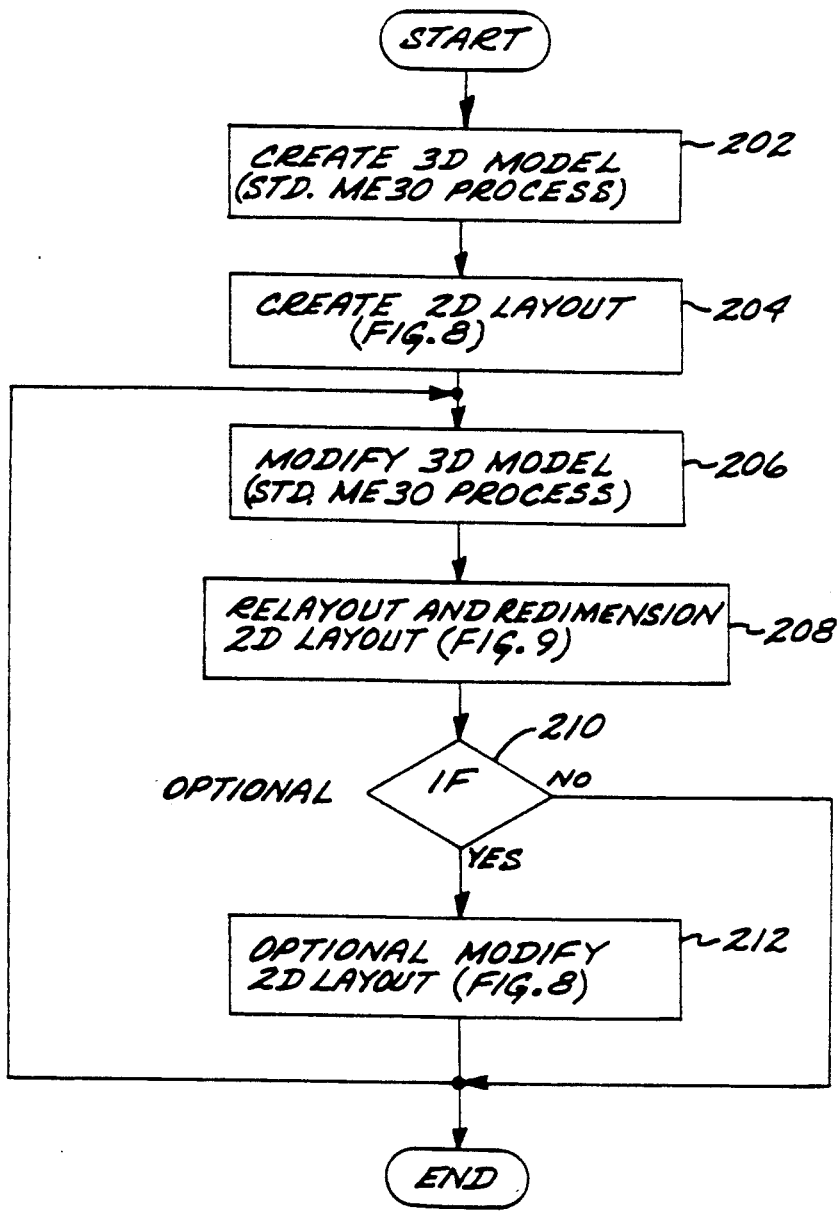
FIGS. 7-16 are flow diagrams illustrating the process of FIG. 3 in further detail.

FIG. 7 shows a flow diagram illustrating the sequence of use of an HP ME 30 system which embodies the present process. At step 202 the 3D model is created using the conventional ME 30 process. Next, at step 204, a layout of the 3D model is created, as shown more fully in FIG. 8. 206), also a conventional ME 30 process. The relayout process is then invoked at step 208 to relayout and redimension the 2D drawing, as shown more fully in FIG. 9. Optionally, at step 212, the user can modify the 2D layout, as described more fully in FIG. 8.

Figure 8:
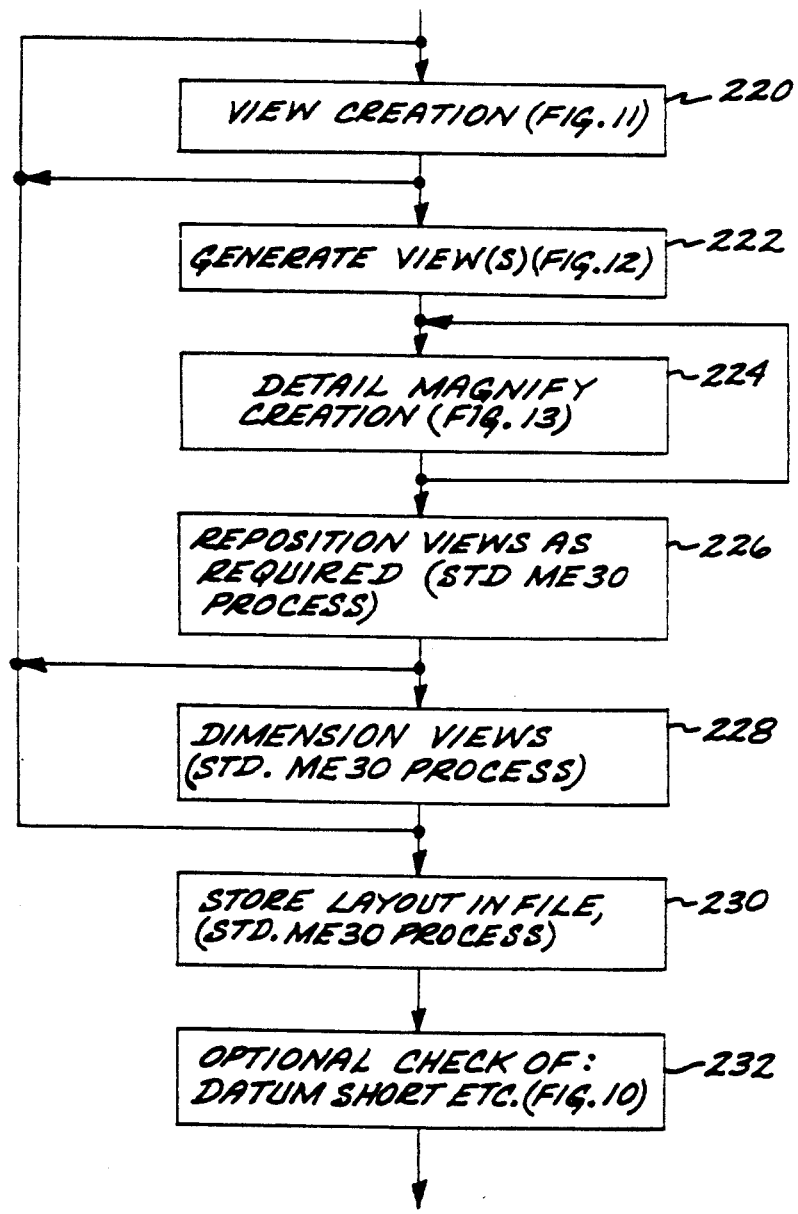

FIG. 8 shows the layout creation (step 204 of FIG. 7). At step 220, the particular views to be created are selected using the menu (FIG. 17). These selected views are then generated at step 222, as will be described more fully in connection with FIG. 12. At step 224, any DETAIL MAGNIFY work is created, as described more fully with respect to FIG. 13. The views are then repositioned as required (step 226) and dimensioned (step 228) in the conventional manner. The layout is stored in the MI file (step 230). An optional check (step 232) of dimension type can then be performed, as described more fully in FIG. 10.

Figure 9:
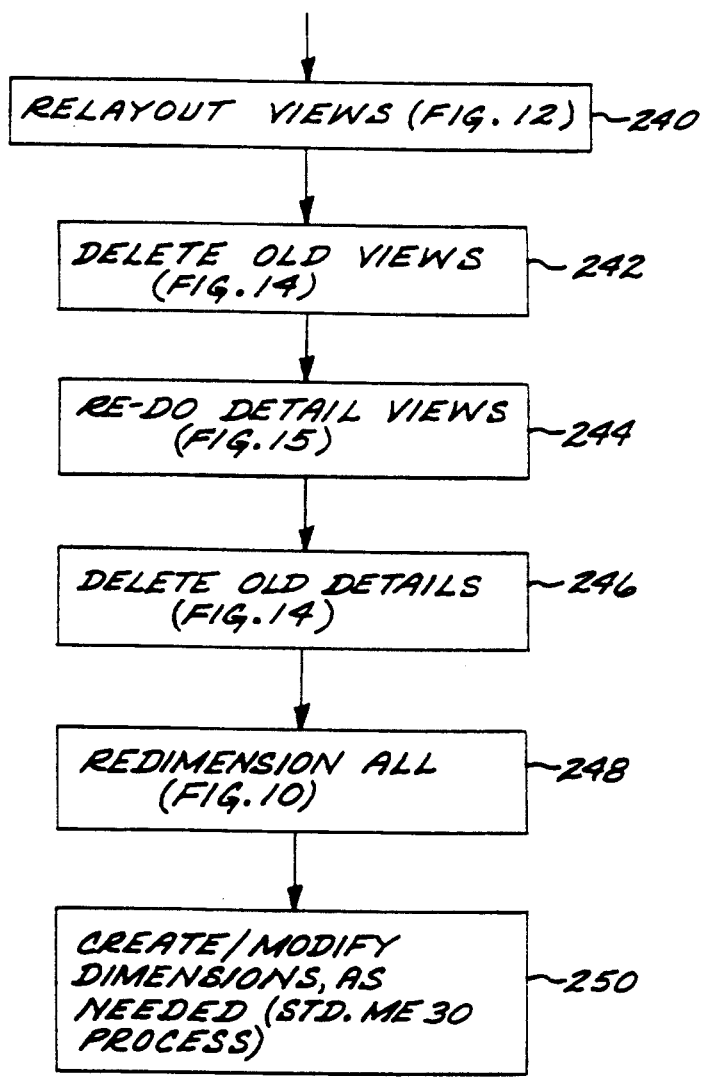
Figure 14:
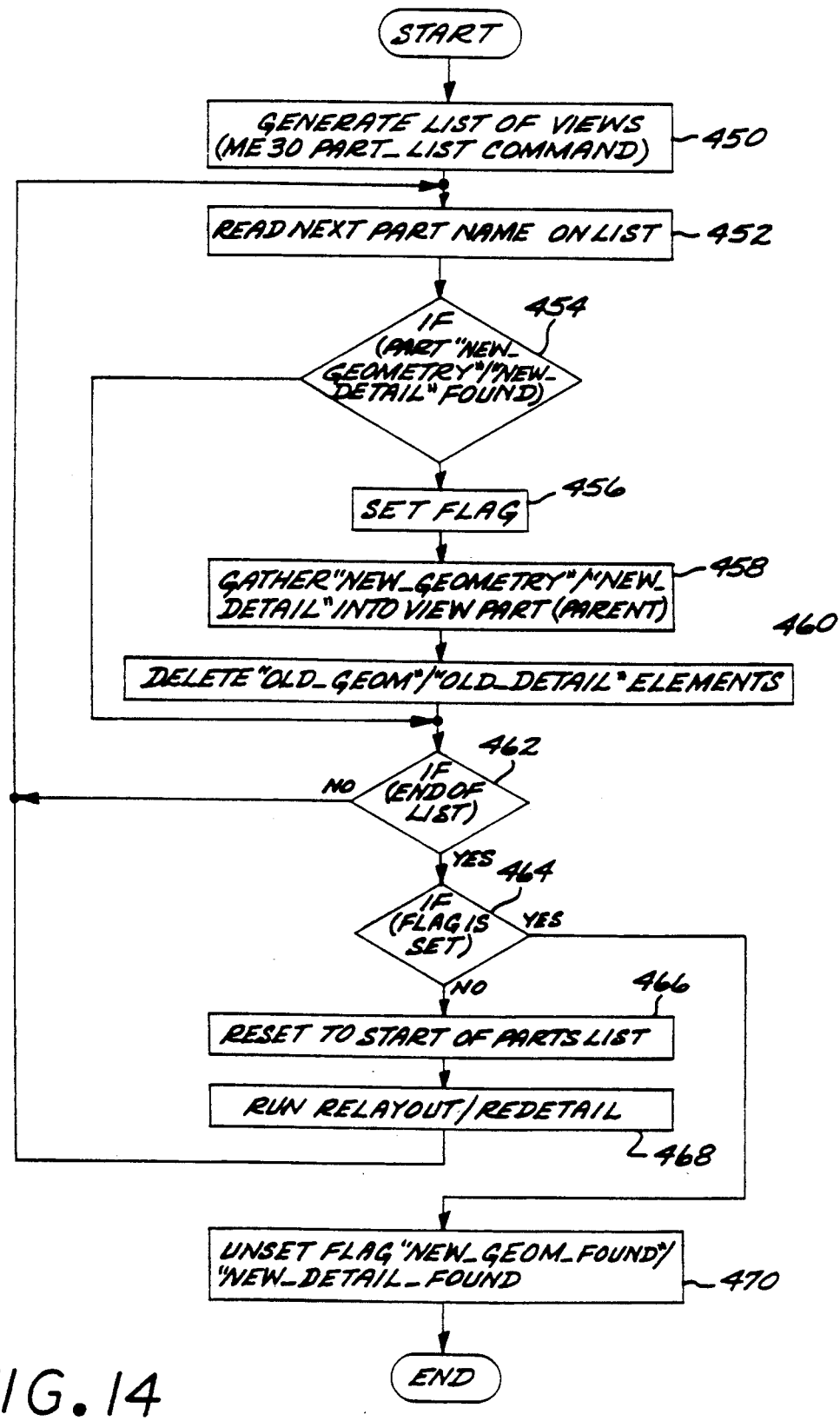
Figure 15:
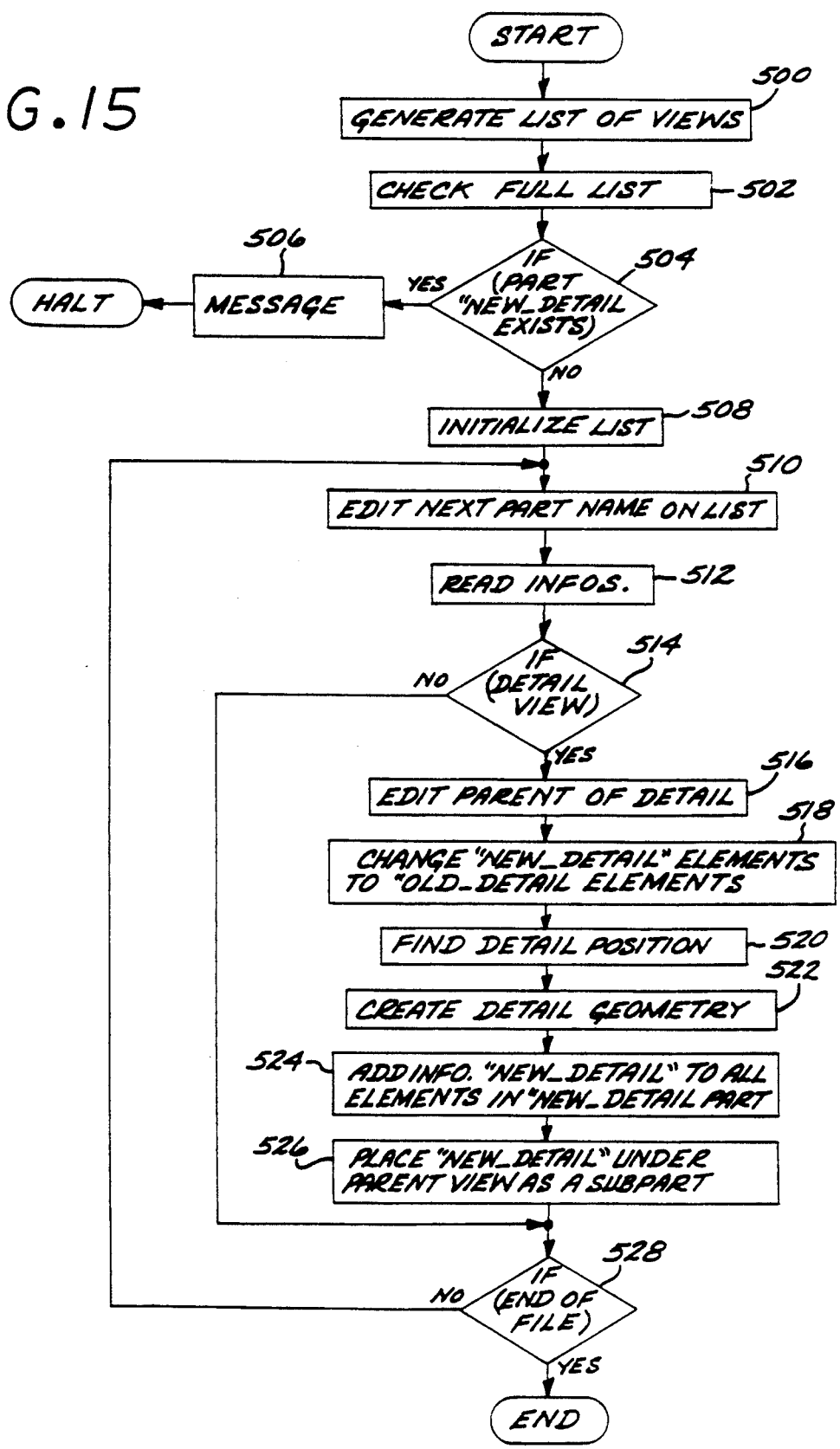
Figure 16A:
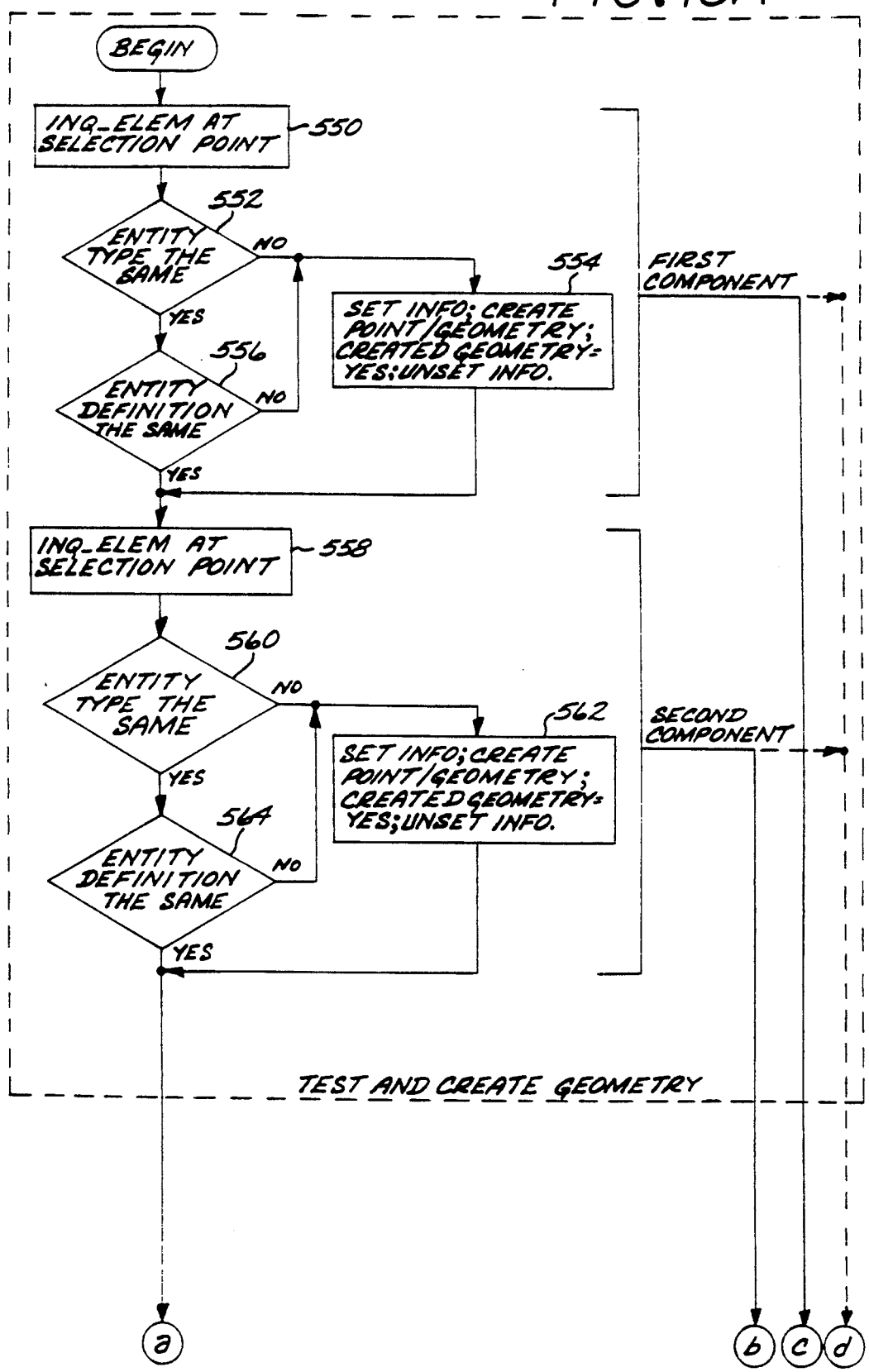
Figure 16B:
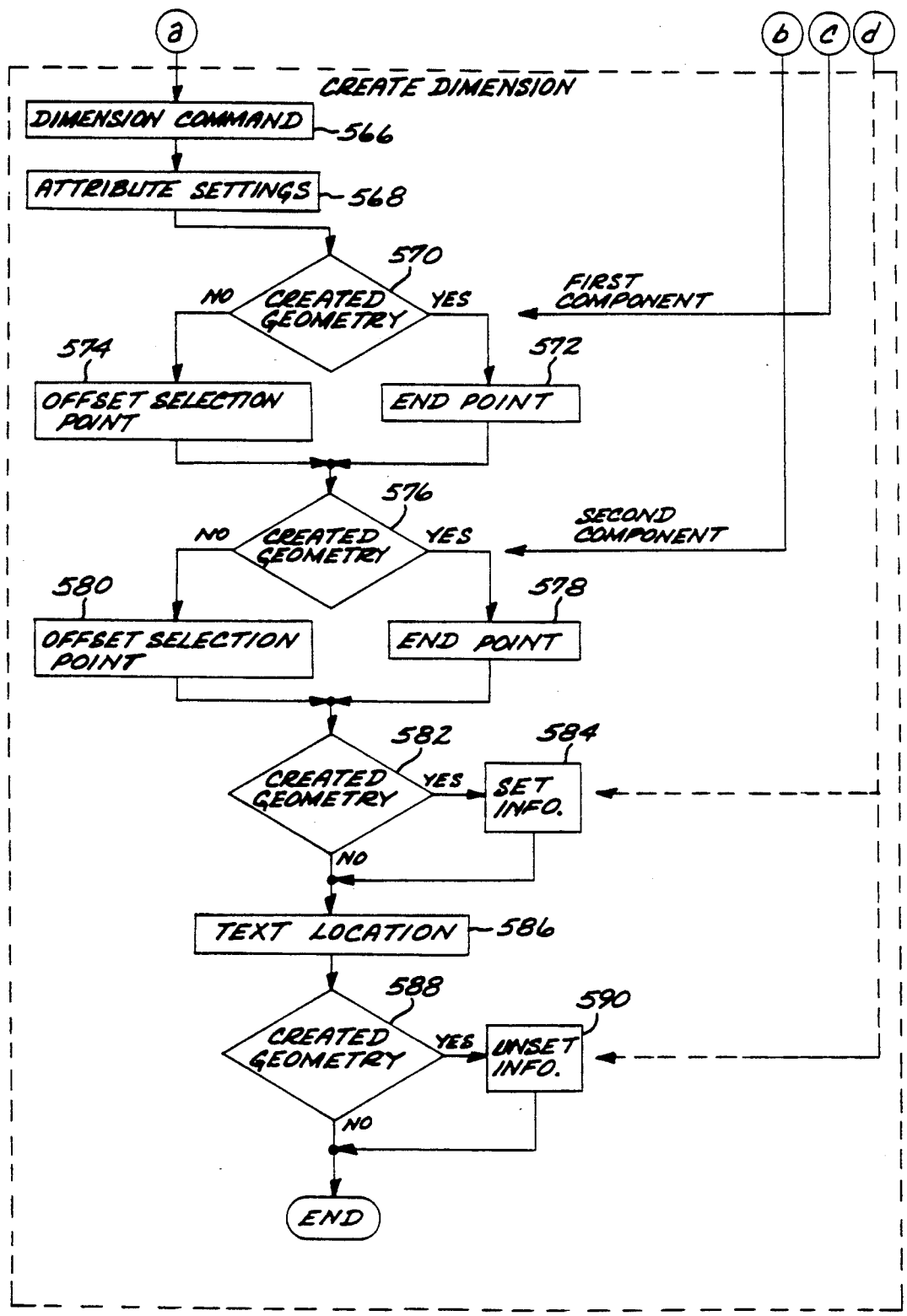

FIG. 9 illustrates the general steps involved in the relayout and redimension process (step 208 of FIG. 7). At step 240, the selected views are relayedout, as described more fully in FIG. 12. At step 242, the old views are deleted, a process described in FIG. 14. Next, at step 244, the detail views are re-done as shown in FIG. 15. The old details are deleted at step 246, as shown in FIG. 14. All views are redimensioned at step 248, as described in FIG. 10. At step 250, dimensions on the views are created and/or modified as required.

Figure 10:
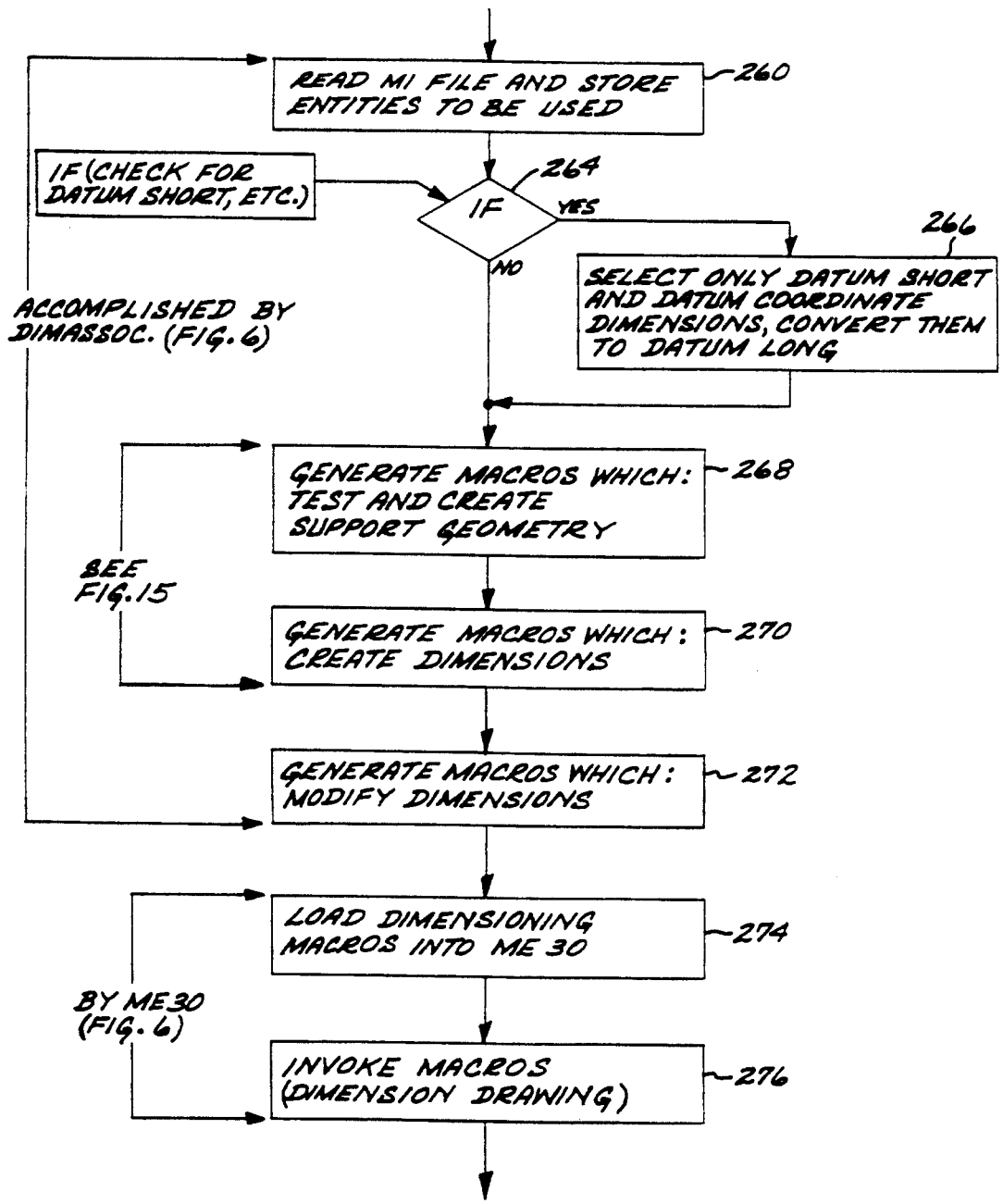

FIG. 10 illustrates the general steps in the process for redimensioning and checking for datum short errors (step 232 in FIG. 8 and step 248 in FIG. 9). At step 260, the MI file is read and the entities to be used are stored. If datum short errors and/or coordinate dimensions are to be converted to datum long dimensions to allow the user to check for the accuracy of dimension placement, this conversion is performed at step 266. Next, at step 268, the macros are generated which test and create the support geometry, i.e., geometry created to replace the original geometry that the dimensions were attached to, but which no longer exists. The macros which create dimensions are generated at step 270. The macros which modify dimensions are created at step 272. The dimensioning macros are then loaded into the ME 30 at step 274, and the macros are invoked to dimension the drawing (step 276). The steps 260-272 are performed by the process DIMASSOC (FIG. 6), and the steps 274 and 276 are performed by the ME 30 (FIG. 6).

Figure 11:
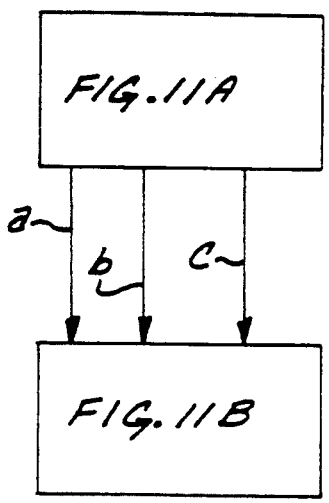

FIG. 11 illustrates the view creation process (step 220 of FIG. 8) in further detail. Here, the view to be created is selected and named (steps 302, 304 and 306). If the view selection is "as is" the relative workplane for the view is found and the view specifications are determined (steps 308 and 310). "As is" refers to using the current solids orientation to obtain a view from its orthographic projection. The solids orientation is set by the user to obtain a view that is not easily available by selection from the layout menu (FIG. 17).

If the view selected is an auxiliary or sectional view and the reference view is chosen by the cursor selection of an existing view in the 2D layout, the view parameters are extracted from the infos stored in association with that existing view. Additionally, the position of the view reference point of the same existing view is measured so that the results can be used for placing the auxiliary or sectional view relative to that same reference view.

An auxiliary view is one based on another view. For example, an auxiliary right view can be made of a right view. The result would be a rear view of the original front view. Usually, however, an auxiliary view is at some angle other than ninety degrees from the reference view.

Sectional views are specified by lines ending with an arrow at each end placed on a selected (reference) view that shows the orientation of the object to be sectioned. The line(s) mark the boundary of the temporarily removed of part of the solid. This removal is done as if a knife is pushed through the solid directly into the object as shown. The resulting (sectional) view of this sectioned solid, especially if it done with a single plane, is usually shown normal to this sectioned surface. This sectional view is placed relative to the reference view based on the direction of the arrows which are used to indicate the direction of the observer's gaze when looking at the view of this section. For the simpler sections these arrows point in the same direction.

Each view has a subpart that contains a single point. This subpart, and by extension, the point within it are both referred to as the reference point. The position of this point can be measured using ME30 tools and indicates the positioning of the view. If the view is moved and the reference point moved with it (a natural occurrence given the part structure relationships and also necessary in order to have the scheme used by the layout program to work correctly) it is easy to determine the new location of the view programmatically.

If the view is not selected by point, the default view specifications are laid out (step 318). If the selected view is an auxiliary view, the auxiliary view specifications are selected (steps 320 and 322). If the view selected is a sectional view, the sectional view specifications are determined (steps 324 and 326). If the view selected is not "as is" then the standard view specifications are looked up at step 328. If the user selects a manual placement of the view (step 330), the view position is selected at step 332. At step 334, the representation box or cuboidal view is created. At step 336 infos are attached to the views and to the lines that form the cuboidal representation, and then the view reference point is created. This completes the view creation process.

Figure 12:
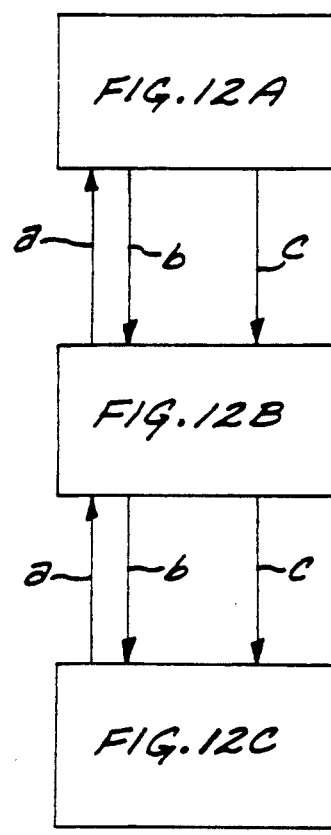

FIG. 12 illustrates the process of generating relayout views (step 222 of FIG. 8). At step 350, the list of views is created using a conventional ME 30 command, the Parts List command. Next, at step 352, the solid parts required for the layout are found in the computer working space, using infos nos. 4, 5 and 6 described above. If the required solids are not present, an appropriate message is generated at step 356 and operation is halted. At step 358, each part is edited so that the attached infos can be read, i.e., selected so that all the information attached to the view and the lines created to show the view can be accessed. If the proper infos for a part have not been found, operation proceeds to step 400. If in the "generate" mode and no part prefix of the form "%#%" is present, indicating that the view with which the prefix is associated has not been generated yet and is still in cuboidal form, operation proceeds to step 400. If such a prefix is present, it is removed (Steps 364 and 366). Now info items 4, 5 and 6 are read, and the required bodies and/or assemblies for this view are placed on the display list (step 368). If the view is not a sectional view as indicated by the absence of both info items 7 and 8, operation branches to step 384. The body is oriented for sectioning using info items 1 and 7 (step 372). A stamping profile is drawn using info item 8 (step 374), and the current body is set using info item 6 (step 376). Now the standard ME 30 machining operation "STAMP" is performed to create the sectioned body (step 378). If there is another body to "STAMP" the stamping tool is recalled as required while incrementing through the list of current bodies (step 382).

At step 384, the body and/or assemblies are positioned using info items 1 and 2, and the view parameters are set (step 386). Next, at step 388, the location of the subpart "view reference point" is found in the ME 30 environment in order to place the just created view directly over the original view. All element infos are changed from "NEW GEOM" to "OLD GEOM" at step 390. Now the new 2D version of the solid is created, using the "LAYOUT 3D" command of the ME 30 system. At step 394, all the elements just created are gathered into a new subpart "New Geometry" and the info "NEW GEOM" is added to all of these new elements. At step 398, the sectioning (stamping) performed on the body or bodies is undone to restore them to their previous form, using the ME 30 "UNDO 3D" command. If not in the "generate" mode, operation returns to step 358 if there is another view on the drawing list. If in the "generate" mode, the view cuboid representation is deleted at step 402, before returning to step 358 if there is another view on the drawing list.

Figure 13:
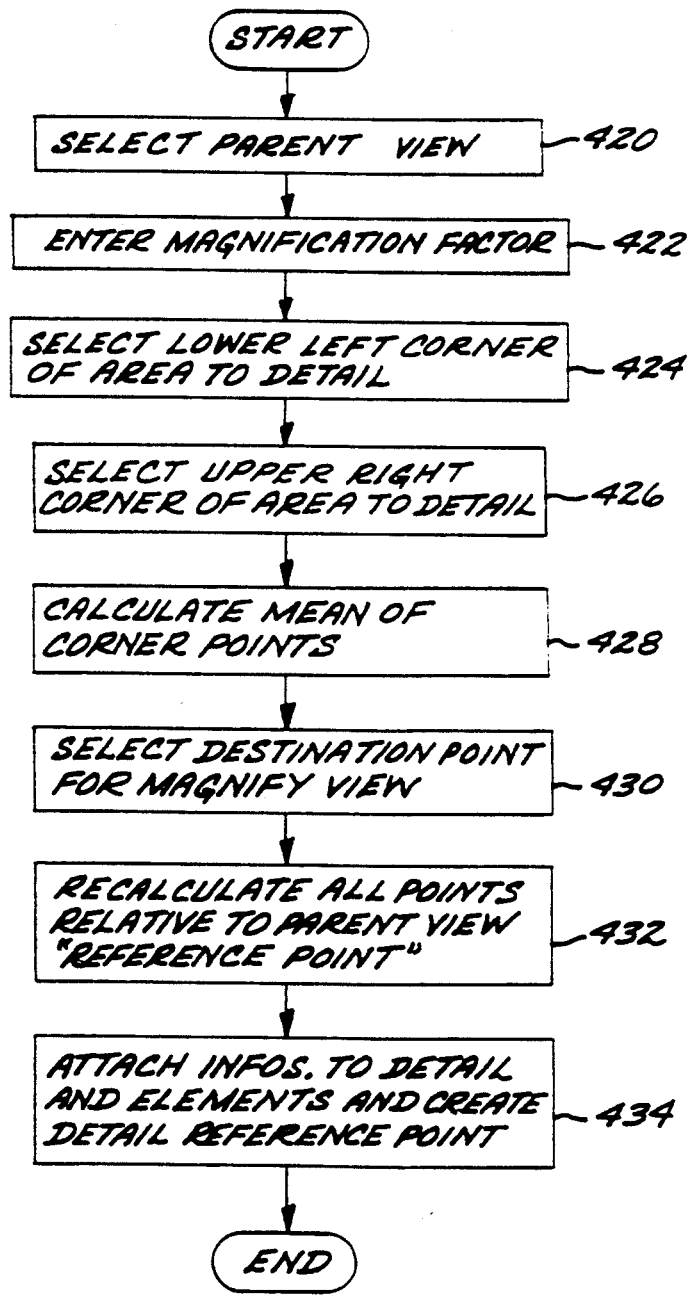

FIG. 13 illustrates the "detail magnify" creation process (step 224 in FIG. 8). At step 420, the user selects the view to be detailed, i.e., the "parent" view. The user then selects the magnification (step 422). The lower left corner and the upper right corner of the area to be detailed are selected (steps 424 and 426). At step 428, the mean of the selected two corners is calculated and used as the source point for the detail move. Next, the destination point for the detail magnify move is selected (step 430), and all points are recalculated relative to the parent view "reference point" (step 432). At step 434, infos are attached to the detail and to the elements in the detail and the detail reference point is created. A "detail reference point" is similar to a "view reference point" and is a point placed in a subpart of the detail view so that the location of this subpart and its included point can be measured to find the current position of the detail view programmatically.

FIG. 14 illustrates the process for deleting old views (step 242 in FIG. 9). "Relayout" refers to those views created from the re-projection of a modified solid onto a viewing plane as described previously regarding FIG. 12, and "re-do the detail" refers to the re-creation of selected portions of existing views that are magnified to allow presentation of smaller details of the drawing at a convenient scale which is described in the following section and in FIG. 15. Either process adds new geometry on top of old geometry. First a list of views is generated using the ME 30 command "PARTS LIST" (step 450). The next view on the list of views is edited so that the infos can be read (step 452). If a part labeled "NEW GEOMETRY"/"NEW DETAIL" is found, a flag is set (steps 454 and 456). The part with this label is gathered into the parent view part (step 458), and any elements labeled "OLD GEOM/OLD DETAIL" are deleted. "Gather" means to reassign the elements of one part (points, lines, arcs and circles) to be elements in another part, in this case the parent or view part. The above steps 452–460 are repeated until the end of the list is reached. If a flag was set in step 456, operation proceeds to step 470, where the flag is cleared, and the process ends. If no flag was set, the process resets to the start of the "list of views" and the "relayout" or "redo detail" process is now run (steps 466 and 468). Note that invoking the process for deleting old views either removes all the old views or, if no old views are present, it does a relayout (or re-do of the detail depending on the way it is called) which is then immediately followed by the deleting of old views which became old as result of the creating of new views to replace them.

FIG. 15 illustrates the process of re-doing the detail views (step 244 of FIG. 9). At step 500, a list of views is generated using the ME 30 "PARTS LIST" command. The contents of the list of views is checked to see if at least one part named "new detail" exists. If a part "new detail" is found, that means that the process of creating a "re-do of the detail views" has already been run, but not completed by the deleting of the old views, and therefore should not be restarted until the previous old views have been deleted. Therefore, the operation halts (steps 504 and 506). The user must resolve this problem, and usually does so by calling the process for deleting old views (see FIG. 14). After this, the user can successfully run the "re-do the detail" process. The list is initialized (step 508), and the next view name on the list is read (step 510) so that the infos for this view can be read (step 512). If the part name is not a detail view, operation proceeds to step 528). Otherwise, the parent of the detail is edited from info item 9 (step 516). "New Detail" elements are changed to "Old Detail" elements at step 518. The detail position is found from the parent view position and the infos (step 520). The detail geometry is created from info item 9 and the part is named "New Detail". An info item "New Detail" is added to all elements in the "New Detail" part (step 524) and the "New Detail" is placed under the parent view as a subpart (step 526). If the part name was the last in the list (step 528) operation of this process ends. Otherwise, operation returns to step 510 to read the next part name on the list.

Figure 16:
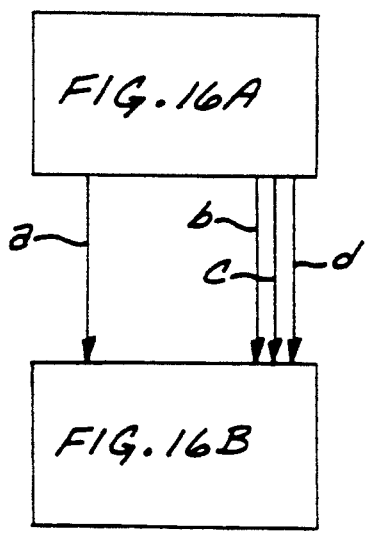
Figure 11A:
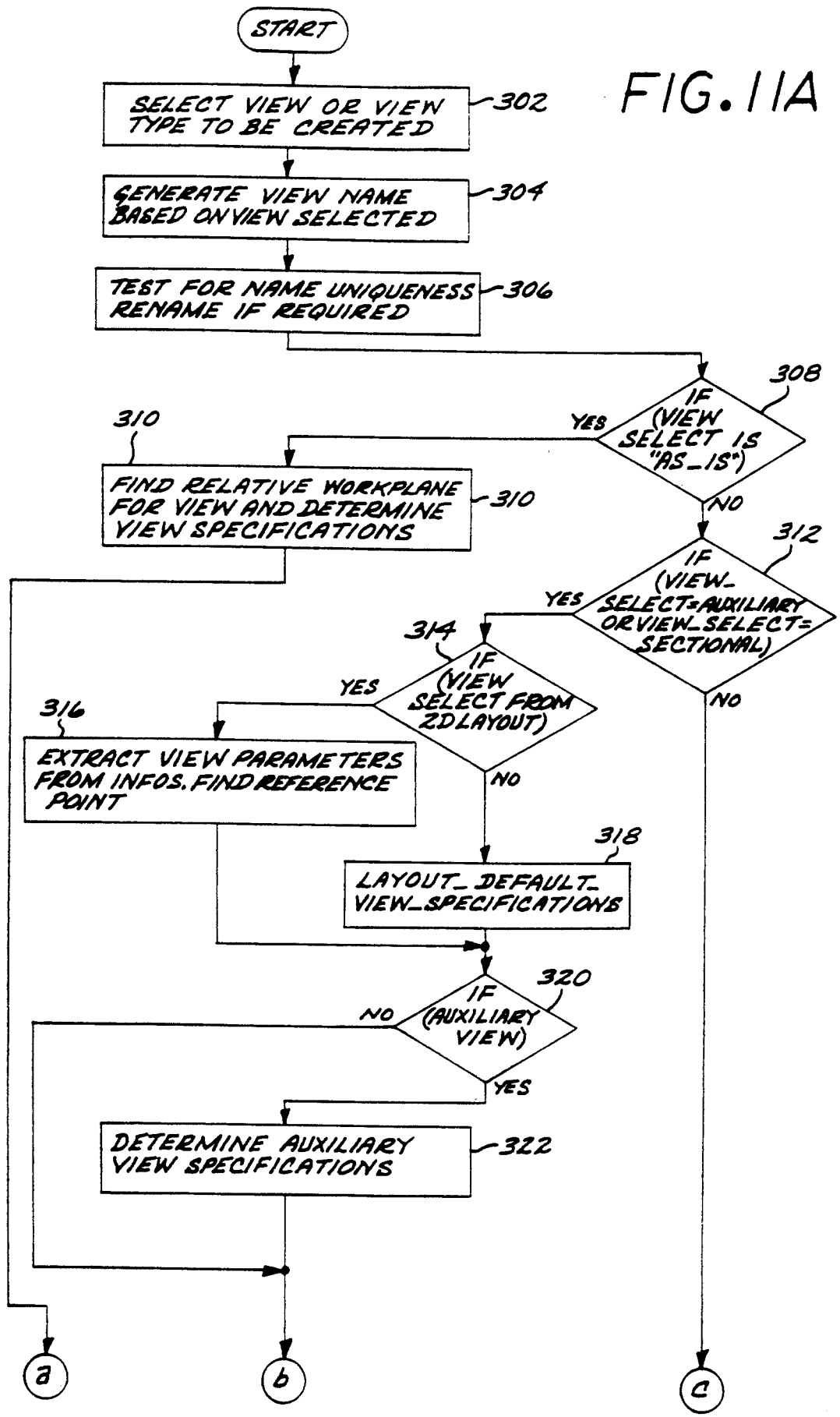
Figure 11B:
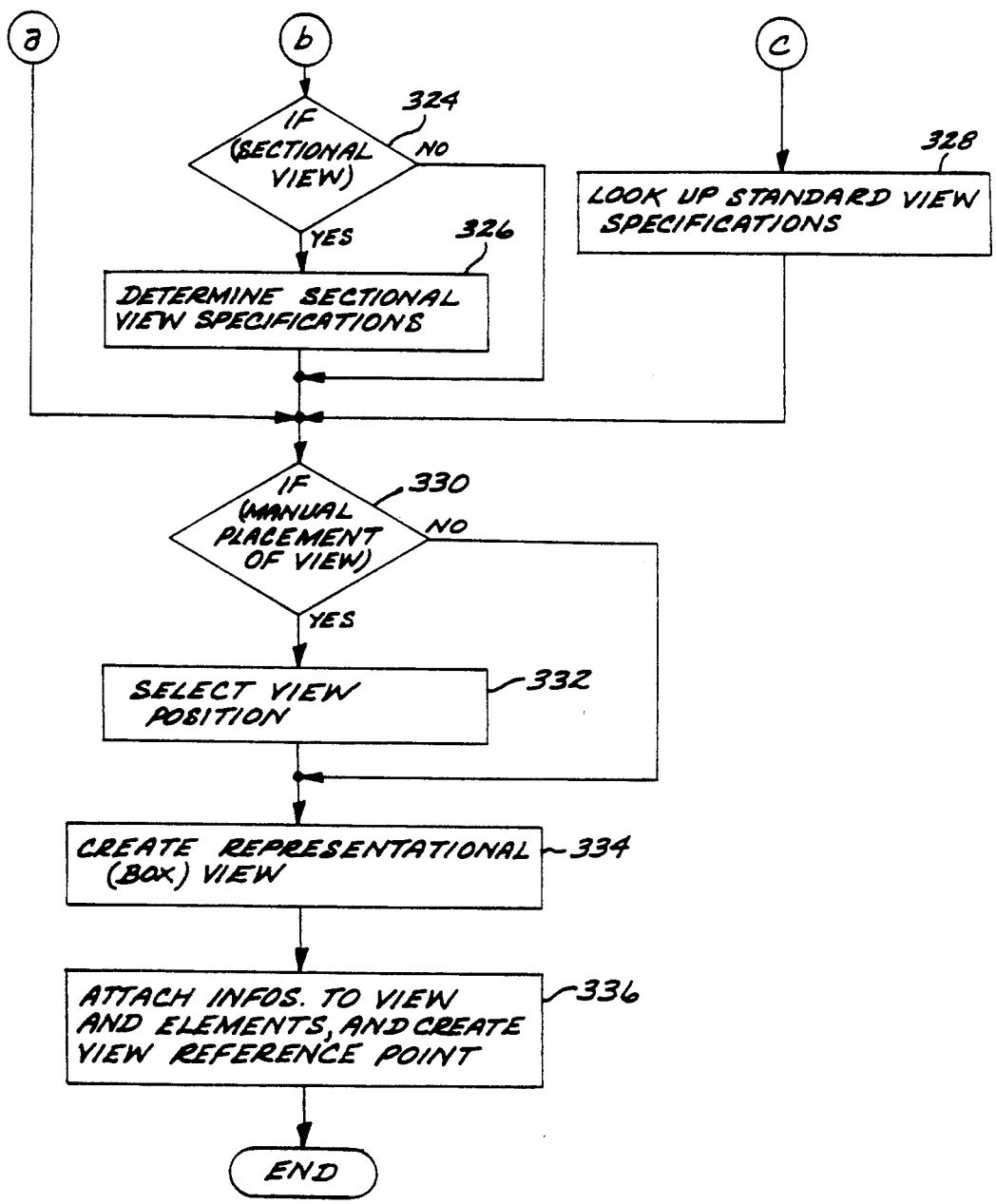
Figure 12A:
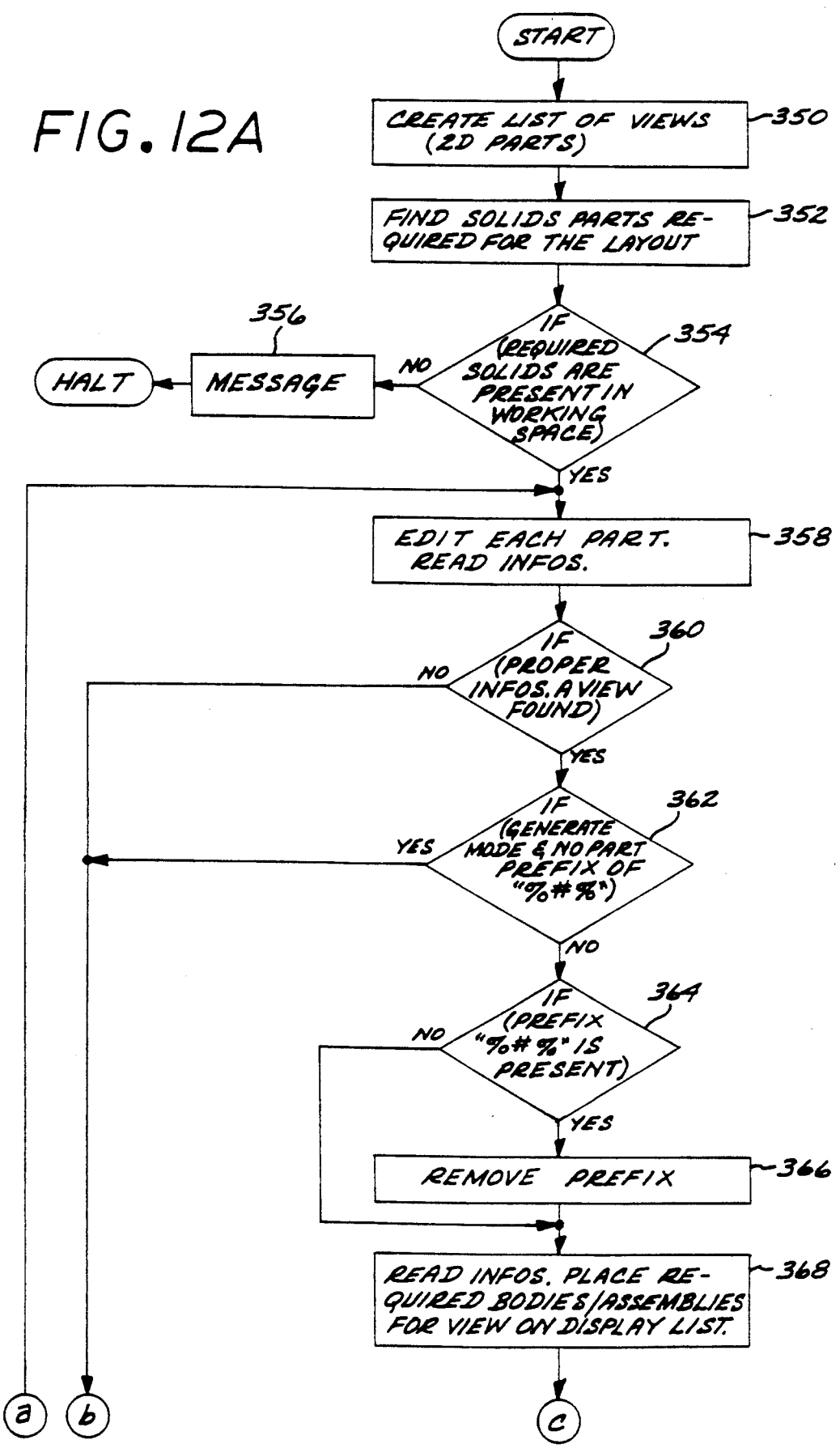
Figure 12B:
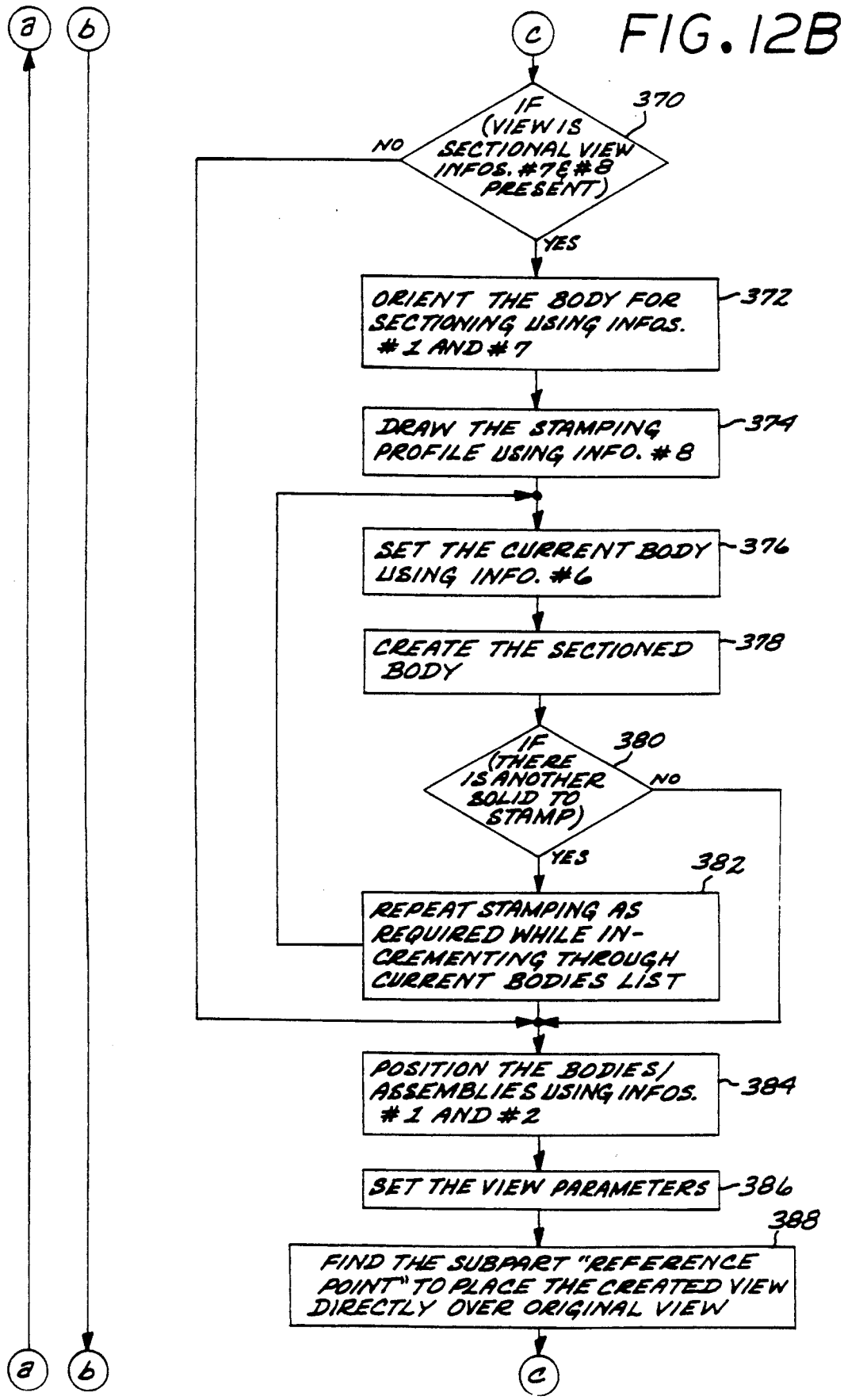
Figure 12C:
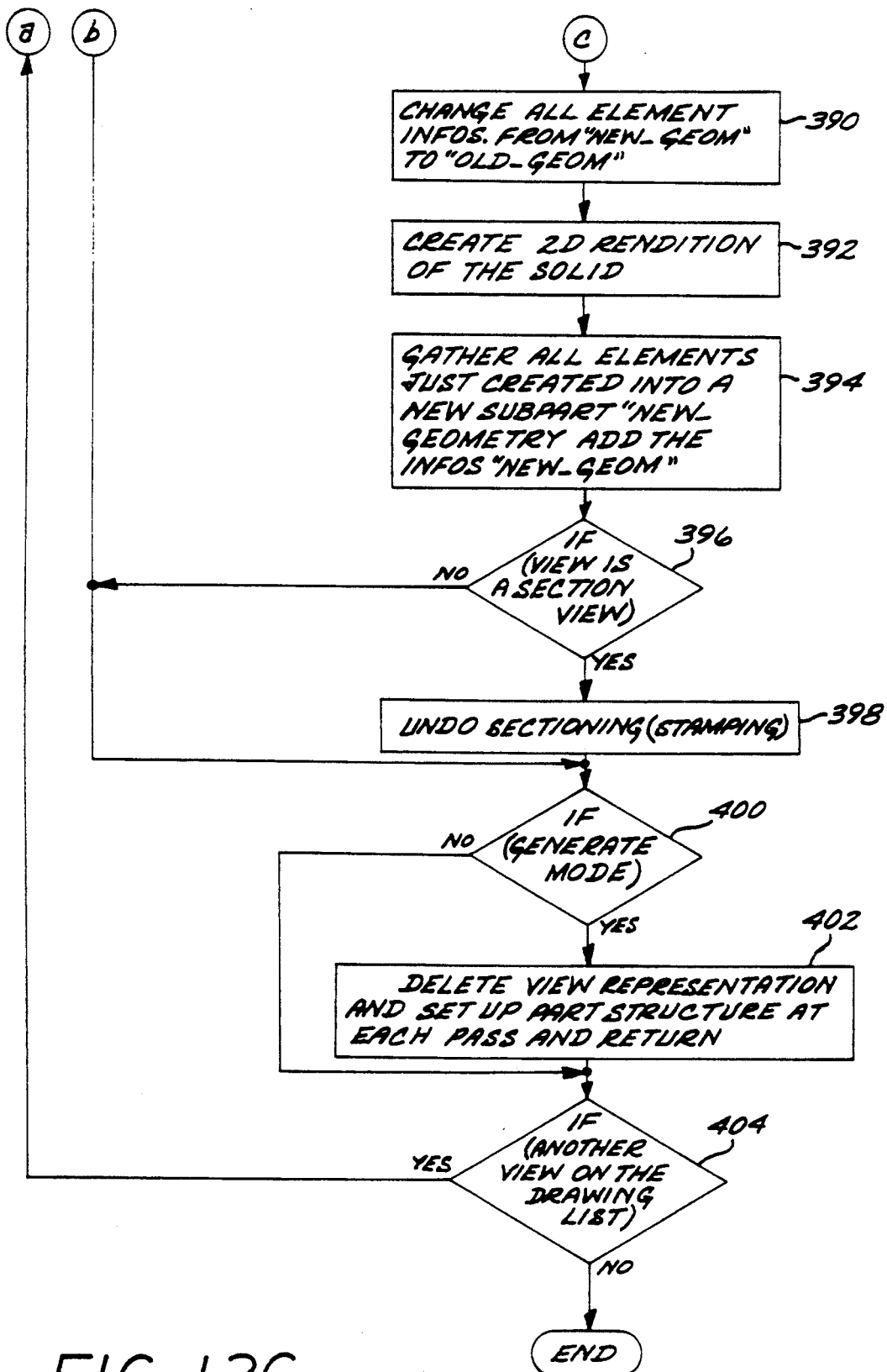

FIG. 16 shows the basic operation of the redimension control logic (steps 268 and 270 of FIG. 10). The objective, at this juncture, is to recreate the dimension on the new drawing as it previously appeared on the old drawing. To do so, the geometry on which the dimension appears must be the same both in position and in type (such as line, arc, circle, etc)., as it previously appeared in the old drawing. Step 550 uses ME30's inquire function with a point calculated to be on the entity very near the end point. The function will return, in an array, the type of entity and the definition of the entity at the selection point, the definition being the end points for a line, the center and radius for a circle, etc. Step 552 determines if the entity found at the point is the same as the entity at the same point in the old drawing. Step 558 determines if the entity is in the same position as it appeared on the old drawing. That is, for example, the end points of the line must be in the same location. If either the entity type is different, or appears in a different location, or does not appear at all, support geometry must be created.

Step 554 creates support geometry with an attached info indicating that it is support geometry. It also sets an internal flag for use in recreating the dimension.

A single dimension may have one or two entities to which it is attached. For example, a dimension of a linear measure has two end points each of which may be on the same or different entities. Both end points must be checked. Steps 558, 560, 564 and 562 check the second end point just as steps 550, 552, 556 and 554 checked the first end point, respectively.

Steps 558–564 will not appear for such dimensions such as radius or diameter because the first check, steps 550–556, fully determines if the dimension may be reproduced without creating support geometry.

Step 566 begins the dimension creation by specifying the type of dimension to be created. Step 568 sets such attributes as color, dimension size, etc. Step 570 uses the flag set, or not set, in step 554, to give the selection end point for the dimension step 574 and 572. If the geometry exists as it previously existed, it is desired to use a point calculated to be very near the end point on the entity to which the dimension was attached. This assures that the dimension will be reattached to the entity to which it was previously attached. If the exact end point is chosen, there is a possibility that the dimension may attach to some other entity which shares the same end point. If support geometry was required, the dimension is attached to the exact location, for it will attach to point geometry before it attaches to other types of geometry.

Steps 576–578 are similar to steps 570–574, but are for the second end point, for those dimensions that have two end points.

Steps 582 and 584 determine and set the info string so that the dimension placed in step 586 will be marked as to whether it is attached to support geometry. If the info was set in step 584, it will be unset via step 588 and 590. Step 586 sets the location of the dimension text. If the info was set in 584, the dimension will have that info associated with it.

FIG. 17 illustrates an exemplary layout creation menu displayed on the ME 30 display screen. The menu outlines the view creation choices, the view rendition options, and the view generation choices, where the cuboid representations are converted to a full line drawing of the view. Here also, detail magnify creation choices permit the user to create a scaled view of an existing view or of a fraction of that view. Special 3D reference points may be added to the 3D model to allow it to be moved and still be relayed out with the views remaining in their original position.

FIG. 18 shows an exemplary relayout/redimension menu displayed on the ME 30 display screen. This menu shows the relayout selections, provides a selection of item which are to be temporarily displayed or not displayed as selected from the menu, provides a selection of items which are permanently selected for deletion, color change or moving, and permits the user to view and/or change any of the infos to correct an existing error in the drawing.

It is understood that the above-described embodiments are merely illustrative of the possible specific embodiments which may represent principles of the present invention. For example, in the preferred embodiment, a 2D drawing was created from a solid, and the revised 2D drawing was created after the solid was modified. Insofar as the redimensioning feature of the invention is concerned, the 2D drawing changes could just have well have been made by a draftsperson working directly on the original 2D drawing. Thus, the redimensioning feature is not limited to changes in a 2D drawing resulting from changes in an associated solid, but is very useful when working strictly with 2D drawings. Changes to a drawing can inadvertently cause the loss of necessary dimensions without the knowledge of the draftsperson as, for example, when working on a small portion of a relatively large drawing where the dimensions, because of the system magnification, are not visible since they are "off the screen." The redimensioning feature can be employed with 2D original and modified drawings to place all the original dimensions back on the modified drawing and mark or indicate those dimensions that were removed during the drawing changes. In addition, it is noted that the redimensioning feature involves a 2D drawing comparison. Any drawing, no matter how it is created, can be compared to another by transferring the dimensions from one to the other. The success or failure of this "dimensioning" indicates the degree of similarity or dissimilarity between the two drawings. The drawing comparator employed in the redimensioning feature can be used to discover all the differences between two 2D drawings, an original and a modified drawing. Other arrangements may readily be devised in accordance with these principles by those skilled in the art without departing from the scope and spirit of the invention.

What is claimed is:

1. A method for interfacing between a solid modeler, which modeler describes objects in three-dimensional (3D) space, and a two-dimensional (2D) documentation package, which package provides 2D representations of objects which are projections of features of said objects onto a viewing plane, said method comprising a sequence of the following steps:
   creating an original 3D analytical model of the object using the solid modeler;
   invoking a 2 D layout process to generate one or more of said 2D representations, which 2D representations are projections of said 3D model onto said viewing plane, and for each such 2D representation, associating projection format information regarding such 2D representation to permit the 2D representation to be reproduced later;
   storing in memory said one or more 2D representations and said projection format information associated therewith;
   modifying said 3D model of the object, using the 3D modeler to incorporate geometry changes in the object, thereby creating a modified 3D model; and
   invoking an automated re-layout process which interfaces with the solid modeler and said modified 3D model, and which recalls from memory said one or more stored 2D representations and said projection format information, and employs said projection format information to automatically generate modified ones of said one or more stored 2D representations which embody any geometry changes resulting from said modifications of the 3D model, wherein said modified one or more 2D representations, represent one or more projections of said modified 3D model onto said viewing plane in accordance with said projection format information.

2. The method of claim 1 wherein said 2D representations comprise one or more views of the object projected onto said viewing plane.

3. The method of claim 2 wherein said projection format information comprises data defining the proper projection position for each said view.

4. The method of claim 1 wherein said re-layout process comprises the step of using said modified 3D model and said stored projection format data to automatically generate modified ones of said 2D representations which embody all geometry changes to said 3D model, wherein geometry that has not changed is located in the same position as in the original representations, and only geometry which has been added or modified during said re-layout process is located in a new position.

5. The method of claim 4 further comprising the step of adding sets of dimensional data to said 2D representations generated by said 2D layout process and storing said dimensional data, and wherein said re-layout process deletes said stored 2D representations and replaces said stored 2D representations with said modified 2D representations, and said re-layout process further comprises the step of automatically associating one or more of said sets of dimensional data from said stored 2D representations with geometry in said modified 2D representations which has not changed.

6. The method of claim 5 wherein said step of automatically associating dimensional data comprises, for each set of said dimensional data, comparing the geometry where said set of dimensional data is to be placed with the geometry with which said set of dimensional data was associated in the original representation to determine whether the geometry has changed, and if the geometry has not changed, associating said dimensional data set with said unchanged geometry in said representation.

7. The method of claim 4 wherein said 2d representations have one or more sets of dimensional data associated therewith to indicate the dimensions thereof, and said re-layout process further comprises the steps of automatically transferring said dimensional data to said modified ones of said 2D representations, and providing an indication that a particular set of dimensional data is associated with geometry which has changed.

8. The method of claim 7 wherein said step of automatically associating dimensional data comprises, for each set of dimensional data, comparing the geometry where the dimensional data is to be placed with the geometry with which it was associated in the original representation to determine whether the geometry has changed, and if the geometry has not changed, associating said dimensional data set with said unchanged geometry in said representation.

9. The method of claim 1 wherein said step of invoking a 2D layout process comprises the step of creating a cuboidal representation of said projections of said 3D model onto said viewing plane.

10. The method of claim 9 wherein said step of invoking a 2D layout process further comprises converting said cuboidal representation into a 2D drawing including the projected details of said 3D model.

11. A method for interfacing between a solid modeler system, which modeler describes objects in three-dimensional (3D) space and a two-dimensional (2D) documentation package, which package provides 2D representations of objects which are projections of features of said objects onto a viewing plane, said method comprising a sequence of the following steps:
   creating an original 3D analytical model of the object using the solid modeler;
   invoking a 2D layout process to generate one or more of said 2D representations which are projections of said 3D model onto said viewing plane, and for each such 2D representation, storing sufficient projection format information regarding such 2D representation to permit the 2D representation to be reproduced later;
   adding dimension data to said 2D representations and storing in memory said one or more dimensioned 2D representations and said projection format information;
   modifying said 3D model of the object, using the solid modeler to incorporate geometry changes in the object, thereby creating a modified 3D model; and
   invoking an automated re-layout process which interfaces with the solid modeler and said modified 3D model, and which recalls from memory said one or more dimensioned 3D representations and said projection format information and employs said projection format information to generate modified ones of said stored one or more 3D representations which embody any geometry changes resulting from said modifications of the 3D model, wherein said modified one or more 2D representations represent one or more projections of said modified 3D model onto said viewing plane in accordance with said projection format information, said modified 2D representations including those dimensions which are still valid after said geometry changes, whereby the user is not required to manually re-enter dimension data on said modified 2D representations which has not changed as a result of said geometry changes in said 3D model.

12. The method of claim 11 wherein said 2D representations comprise one or more views of the object projected onto said viewing plane.

13. The method of claim 12 wherein said projection format information comprises data defining the proper projection position for each said view.

14. The method of claim 11 wherein said re-layout process comprises the step of using said modified 3D model and said stored projection format data to automatically generate modified ones of said 2D representations which embody all geometry changes to said 3D model, wherein geometry that has not changed is located in the same position as in the original representations, and only geometry which has been added or modified during said re-layout process is located in a new position.

15. The method of claim 14 wherein said re-layout process further comprises the step of automatically associating sets of dimensional data from said stored 2D representations with geometry in said modified 2D representations which has not changed.

16. The method of claim 15 wherein said step of automatically associating dimensional data comprises, for each set of dimensional data, comparing the geometry where the dimensional data is to be placed with the geometry with which said set of dimensional data was associated in the original representation to determine whether the geometry has changed, and if the geometry has not changed, associating said dimensional data set with said unchanged geometry in said representation.

17. The method of claim 11 further comprising the steps of transferring all dimensional data from said 2D representation to said modified 2D representations, and providing an identification of the transferred dimensional data which is associated with changed geometry.

18. The method of claim 17 wherein said re-layout process further comprises the step of, for each set of dimensional data, comparing the geometry where the dimensional data is to be placed with the geometry with which it was associated in the original representation to determine whether the geometry has changed, and if the geometry has not changed, associating said dimensional data set with said unchanged geometry in said representation.

19. A method for automatically transferring dimensional data from a first two dimensional representation of a drawing object to a second two dimensional representation, comprising the steps of:

storing in memory data defining said first two dimensional representation of said drawing object, wherein one or more sets of dimensional data are associated with corresponding geometry elements of said first two dimensional representation;

creating said second two dimensional representation, said second representation having at least one geometry element identical to a corresponding geometry element of said first representation; and automatically transferring to said geometry elements of said second representation which identical to said one or more corresponding elements of said first representation said one or more of said sets of dimensional data.

20. The method of claim 19 wherein said step of automatically transferring said one or more sets of dimensional data comprises, for each set of dimensional data, comparing each geometry element where the dimensional data is to be placed in said second representation with each corresponding geometry element with which it was associated in said first representation to determine whether said respective geometry elements are identical, and if identical, associating said dimensional data set with each said geometry element in said second representation.

21. The method of claim 19 wherein said step of automatically transferring said dimensional data comprises (i) transferring all said sets of dimensional data to said second two dimensional representation, (ii) for each said transferred set of dimensional data, comparing a geometry element with which it was associated in said first representation to determine whether said elements are identical, and (iii) if said geometry elements are identical, providing an indication showing that said set of dimensional data is associated with geometry in said second representation which is not identical to that in said first representation.

22. The method of claim 19 further comprising the step of performing an accuracy check on said sets of dimensional data, said step comprising converting each dimensional data set of the type which do not show the common datum for a series of dimensions into a dimensional data set of the type which does show the common datum for a series of dimensions.

23. The method of claim 22 wherein said step of performing an accuracy check further comprises the initial step of deleting all sets of dimensional data which are not of the type which do not show the common datum for a series of dimensions, and thereafter converting the remaining sets into sets of dimension data of the type which does show the common datum for a series of dimensions.

* * * * *